(12) United States Patent
Son et al.

(10) Patent No.: US 8,350,344 B2
(45) Date of Patent: Jan. 8, 2013

(54) SEMICONDUCTOR DEVICE AND METHOD OF FABRICATING THE SAME

(75) Inventors: Jung-Min Son, Yongin-si (KR); Woon-Kyung Lee, Seongnam-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/044,766

(22) Filed: Mar. 10, 2011

(65) Prior Publication Data

US 2011/0220985 A1 Sep. 15, 2011

(30) Foreign Application Priority Data

Mar. 10, 2010 (KR) .................. 10-2010-0021370

(51) Int. Cl.
*H01L 29/78* (2006.01)
*H01L 29/788* (2006.01)
*H01L 29/792* (2006.01)
*H01L 23/48* (2006.01)
*H01L 23/52* (2006.01)
*H01L 29/40* (2006.01)
*H01L 21/336* (2006.01)
*H01L 21/3205* (2006.01)
*H01L 21/4763* (2006.01)
*H01L 21/44* (2006.01)

(52) U.S. Cl. ........ 257/413; 257/316; 257/324; 257/326; 257/770; 257/E23.129; 257/E29.156; 257/E29.309; 257/E21.199; 257/E21.423; 257/E21.622; 257/E21.68; 438/257; 438/258; 438/287; 438/587; 438/591; 438/593; 438/596; 438/655; 438/656; 438/657; 438/660; 438/954

(58) Field of Classification Search ............... None
See application file for complete search history.

(56) References Cited

U.S. PATENT DOCUMENTS

| | | | | |
|---|---|---|---|---|
| 5,268,330 A * | 12/1993 | Givens et al. | ............... | 438/586 |
| 5,739,573 A * | 4/1998 | Kawaguchi | ............... | 257/384 |
| 5,851,890 A * | 12/1998 | Tsai et al. | ............... | 438/303 |
| 5,920,783 A * | 7/1999 | Tseng et al. | ............... | 438/305 |
| 6,046,105 A * | 4/2000 | Kittl et al. | ............... | 438/655 |
| 6,136,658 A * | 10/2000 | Shinmura | ............... | 438/305 |
| 6,187,675 B1 * | 2/2001 | Buynoski | ............... | 438/655 |
| 6,194,297 B1 * | 2/2001 | Cheng | ............... | 438/592 |
| 6,461,951 B1 * | 10/2002 | Besser et al. | ............... | 438/592 |
| 6,507,078 B1 * | 1/2003 | Yu | ............... | 257/388 |
| 6,509,264 B1 * | 1/2003 | Li et al. | ............... | 438/682 |
| 6,630,721 B1 * | 10/2003 | Ligon | ............... | 257/413 |
| 6,673,665 B2 * | 1/2004 | Wieczorek et al. | ............... | 438/233 |
| 6,867,130 B1 * | 3/2005 | Karlsson et al. | ............... | 438/655 |
| 7,112,498 B2 * | 9/2006 | Jung | ............... | 438/303 |

(Continued)

FOREIGN PATENT DOCUMENTS

JP 2008-160010 A 7/2008

(Continued)

*Primary Examiner* — Hoang-Quan Ho
(74) *Attorney, Agent, or Firm* — Muir Patent Consulting, PLLC

(57) ABSTRACT

Provided are a semiconductor device and a method of fabricating the same. The semiconductor device may include a charge storage structure and a gate. The charge storage structure is formed on a substrate. The gate is formed on the charge storage structure. The gate includes a lower portion formed of silicon and an upper portion formed of metal silicide. The upper portion of the gate has a width greater than that of the lower portion of the gate.

33 Claims, 33 Drawing Sheets

U.S. PATENT DOCUMENTS

| | | | |
|---|---|---|---|
| 7,446,381 B2* | 11/2008 | Hashidzume et al. | 257/412 |
| 7,456,095 B2* | 11/2008 | Wong et al. | 438/630 |
| 7,622,339 B2* | 11/2009 | Hall et al. | 438/182 |
| 7,759,741 B2* | 7/2010 | Wong et al. | 257/382 |
| 7,981,795 B2* | 7/2011 | Matsuo et al. | 438/664 |
| 2002/0149081 A1* | 10/2002 | Goda et al. | 257/510 |
| 2006/0006478 A1* | 1/2006 | Kanegae et al. | 257/382 |
| 2007/0029603 A1* | 2/2007 | Lee et al. | 257/315 |
| 2007/0108498 A1* | 5/2007 | Lee et al. | 257/315 |
| 2009/0026527 A1* | 1/2009 | Ryusenji et al. | 257/316 |

FOREIGN PATENT DOCUMENTS

| | | |
|---|---|---|
| JP | 2009-026802 A | 2/2009 |
| KR | 10-2002-0052646 A | 7/2002 |

* cited by examiner

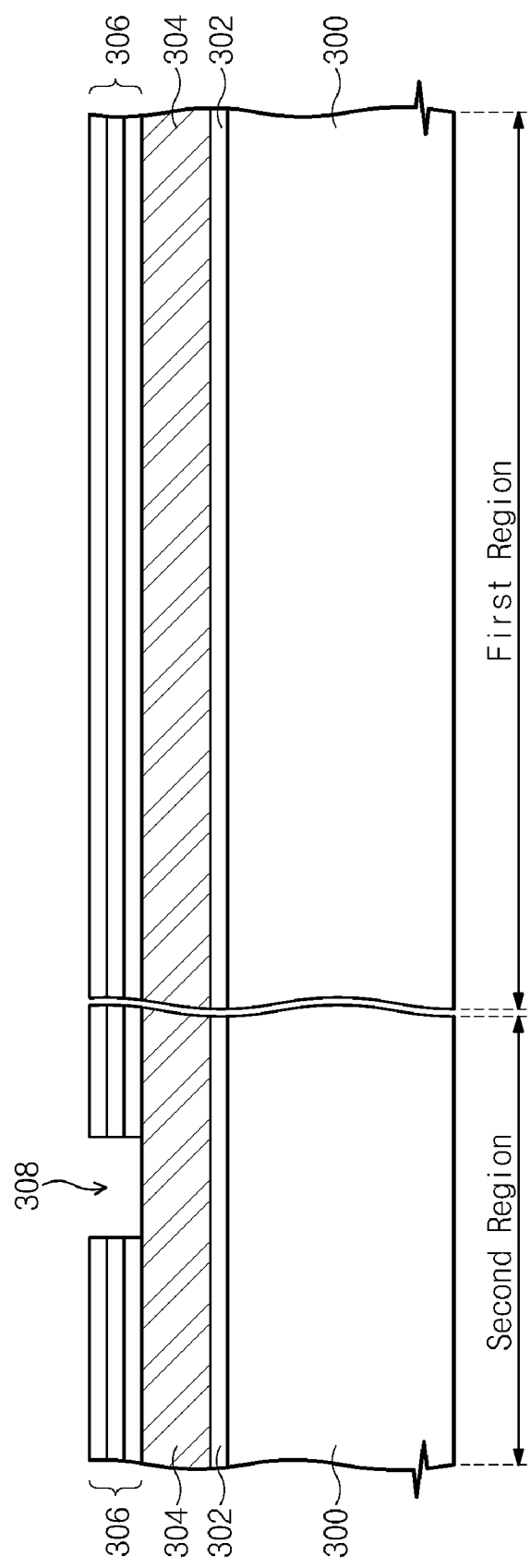

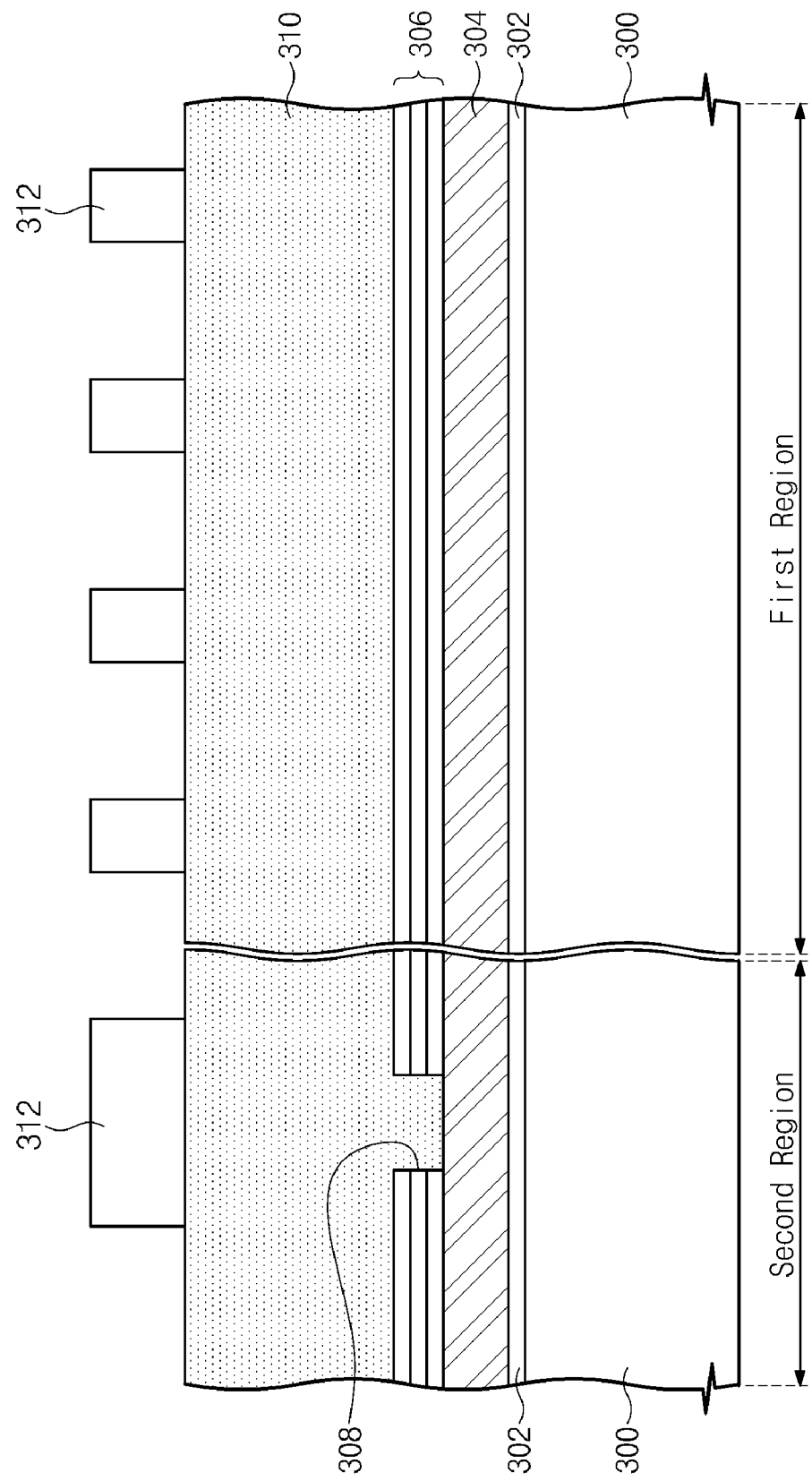

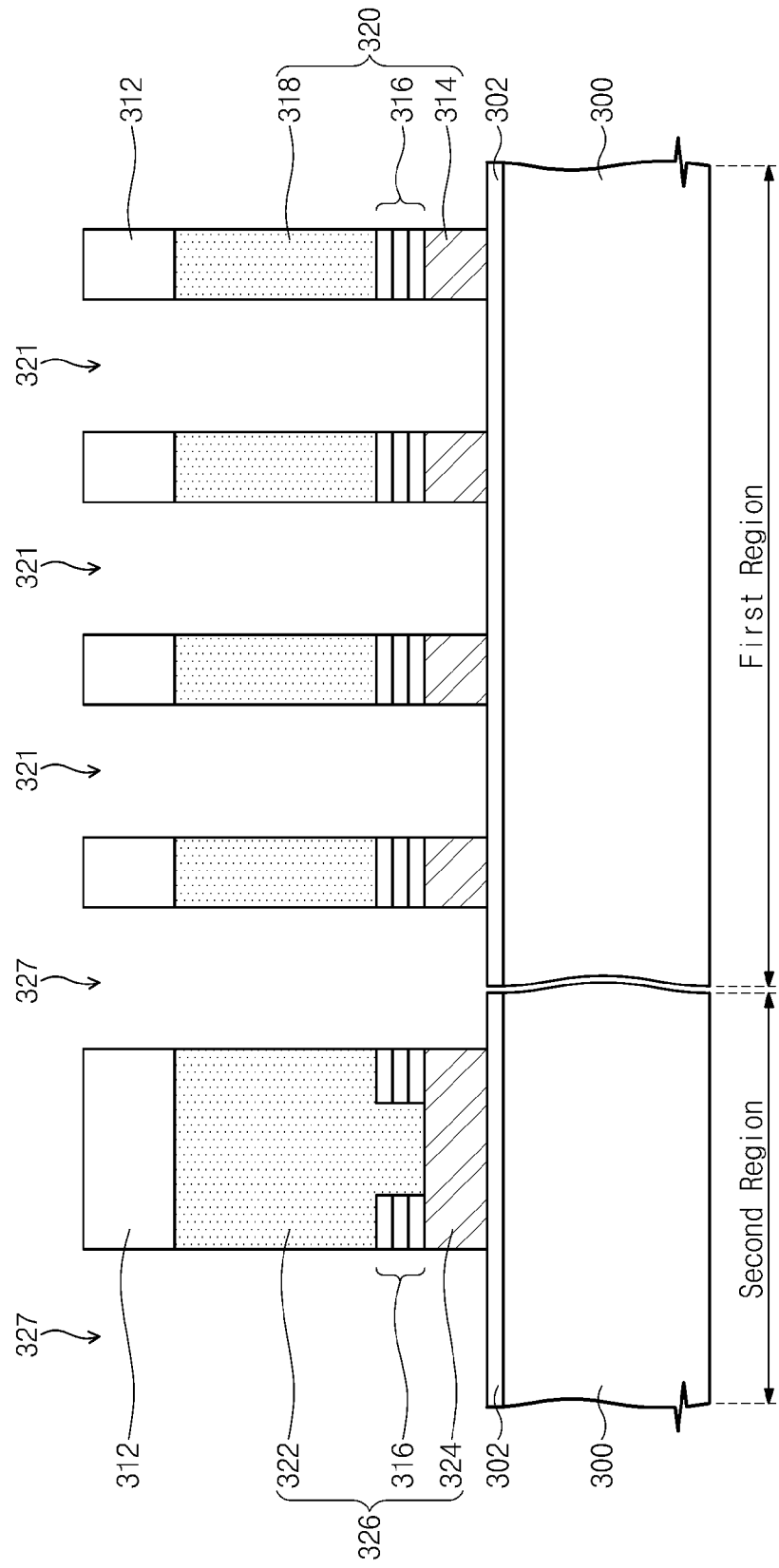

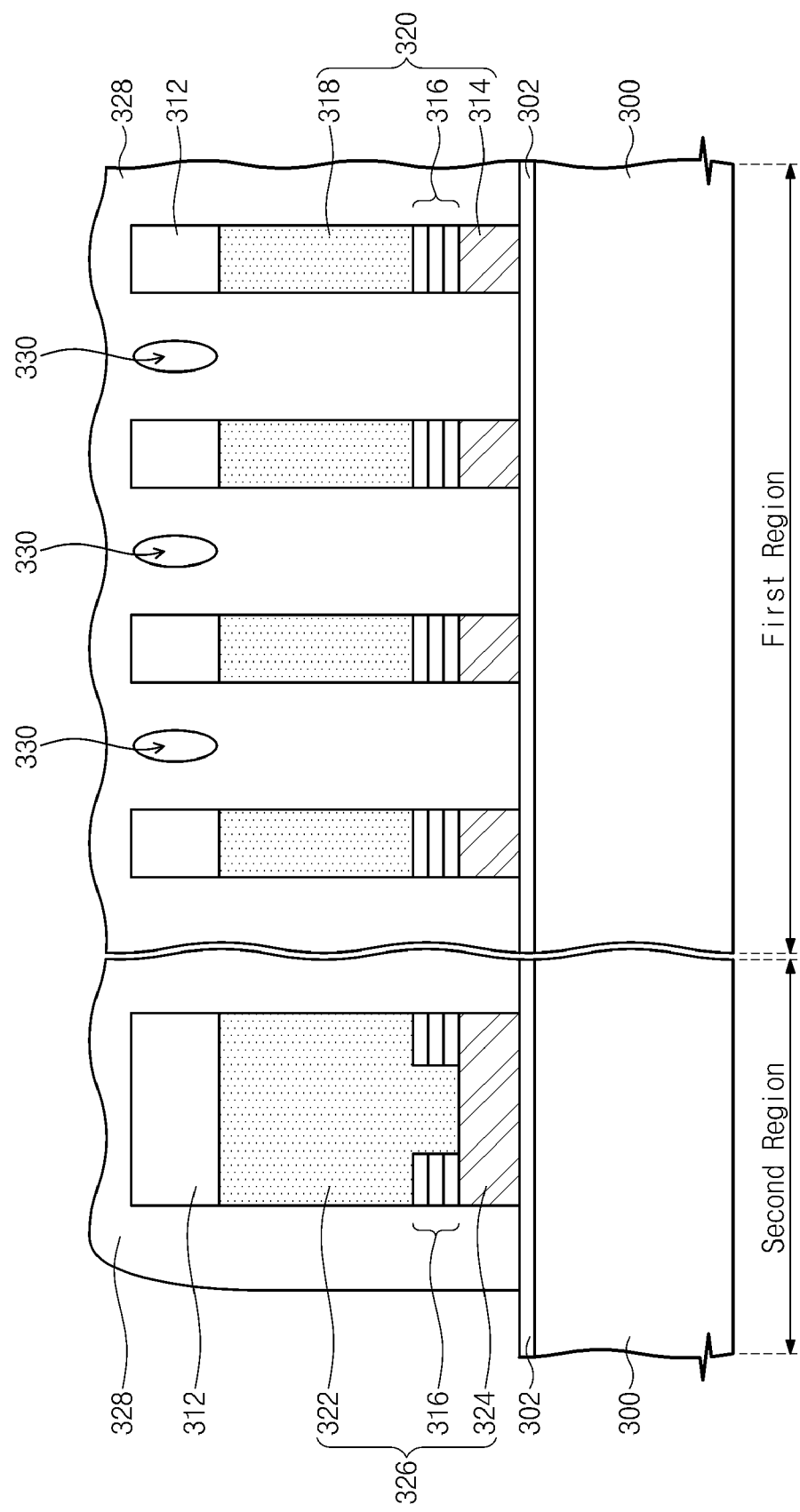

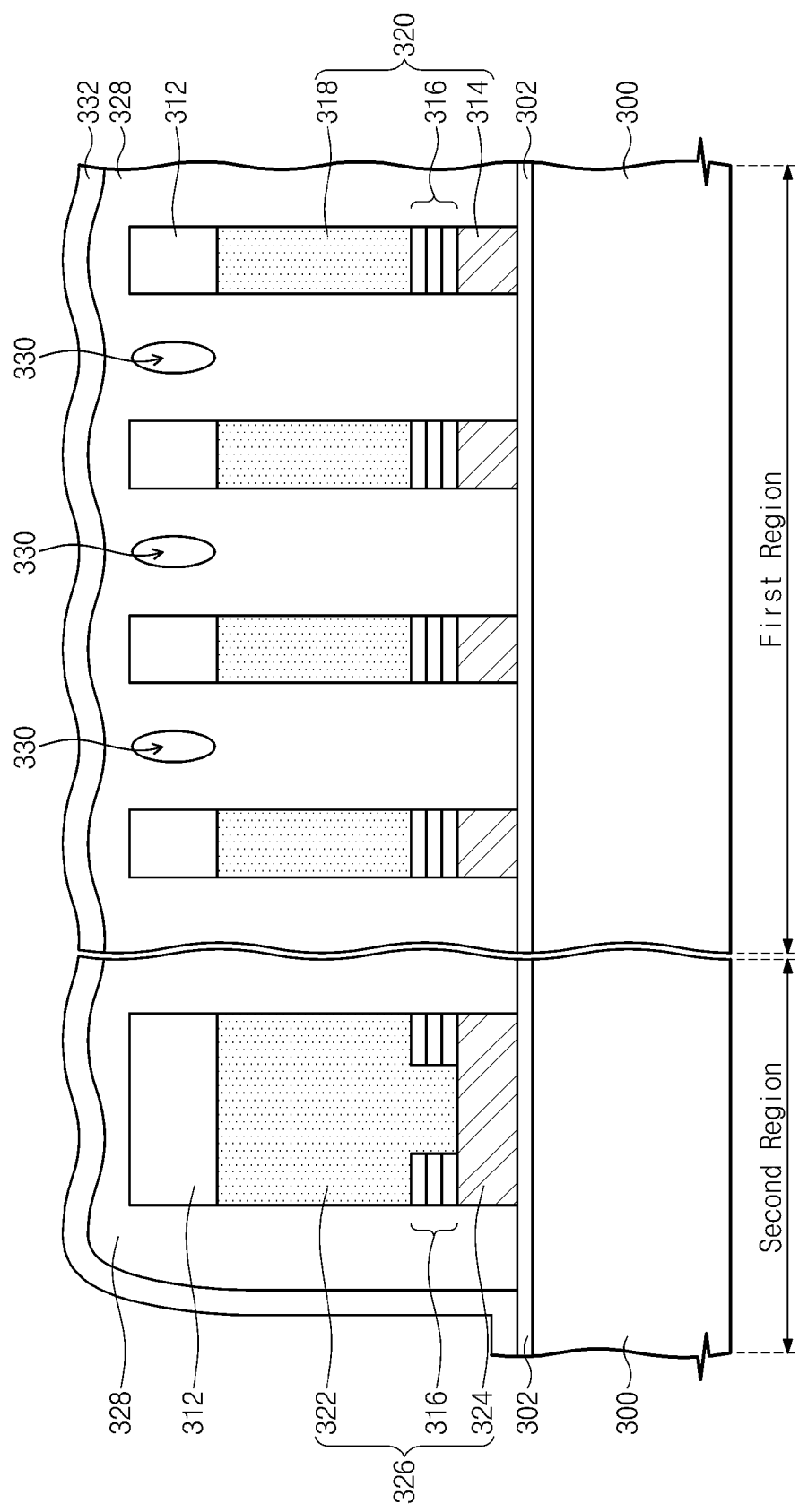

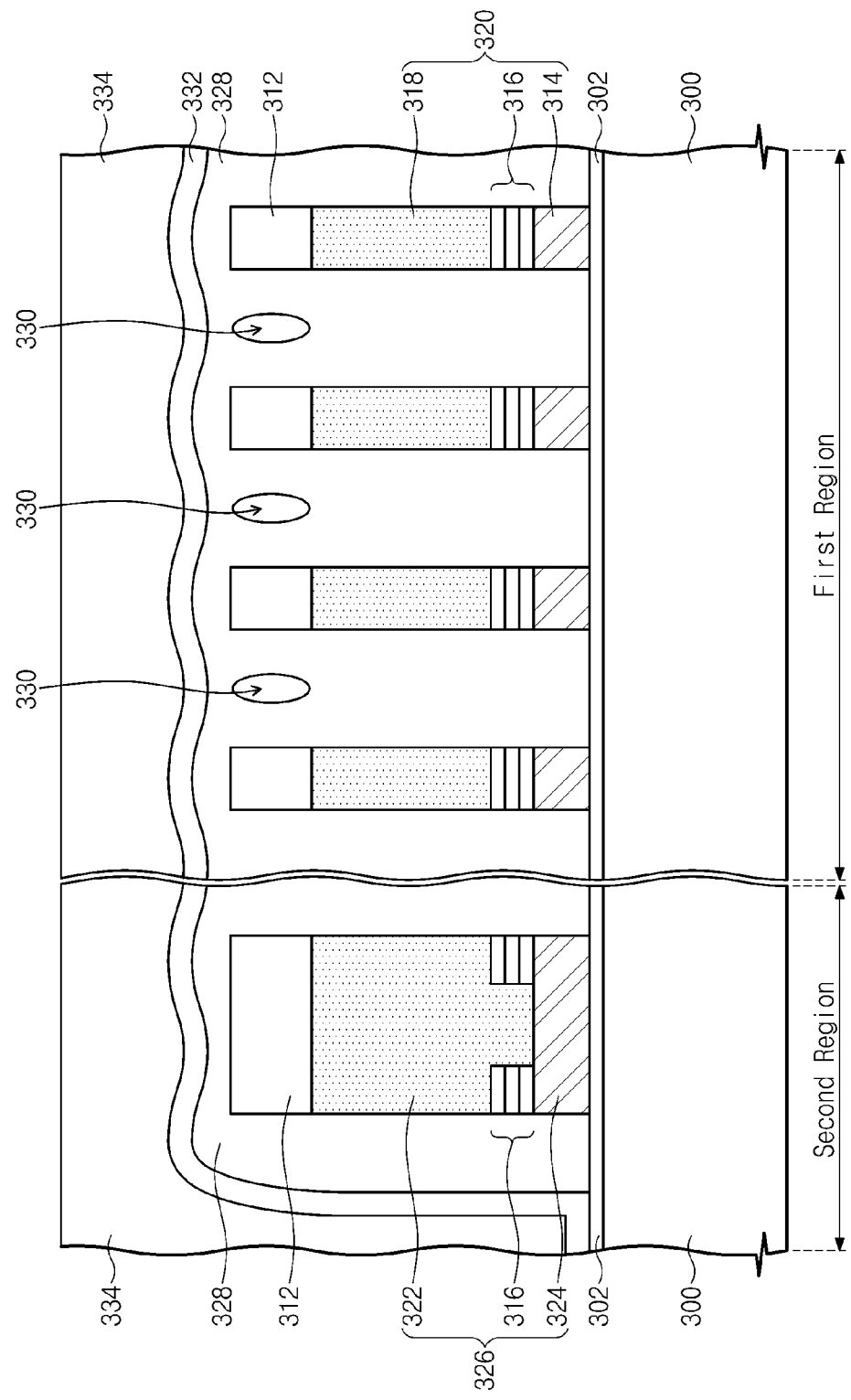

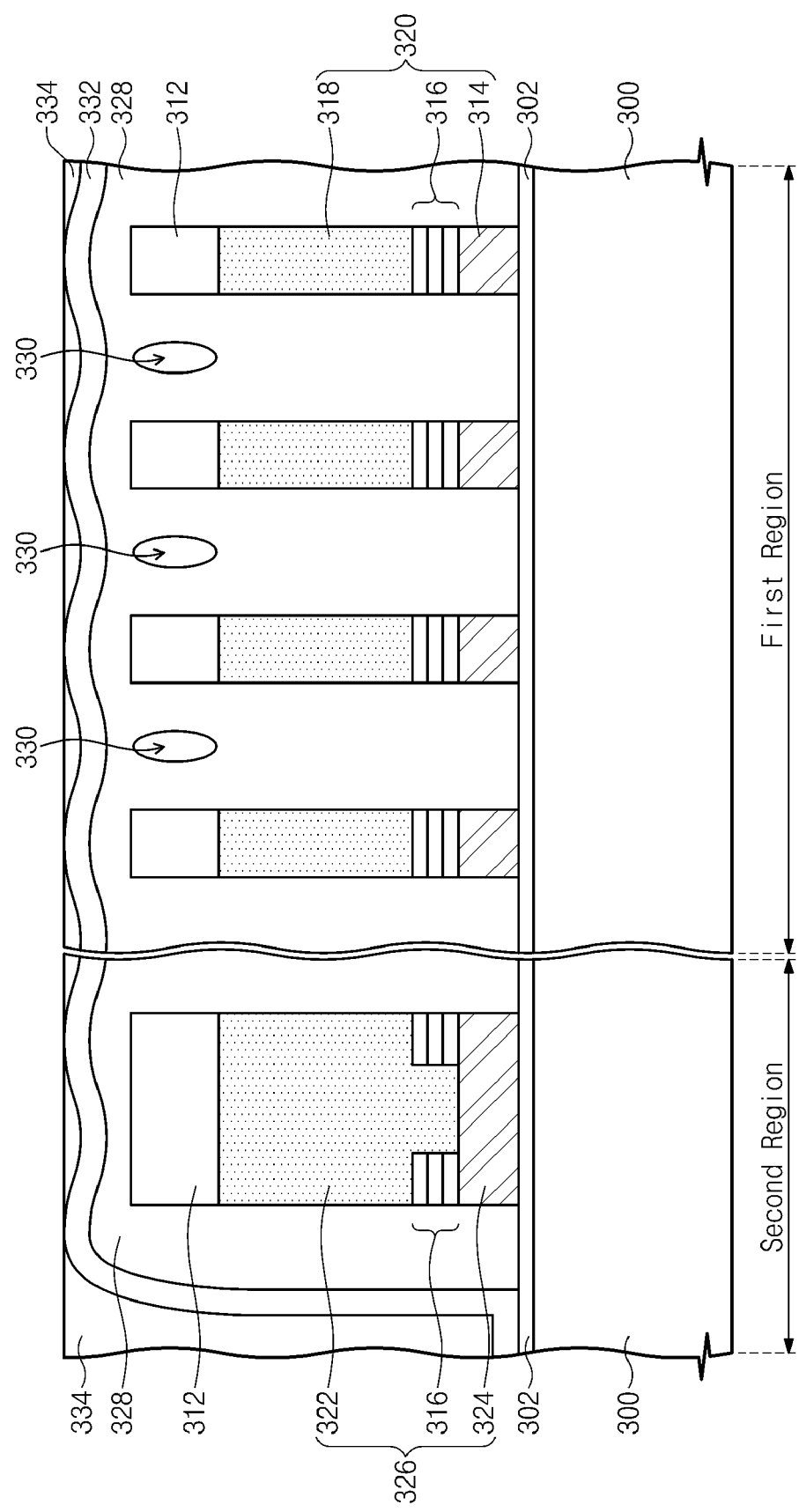

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 from Korean Patent Application No. 10-2010-0021370, filed in the Korean Intellectual Property Office on Mar. 10, 2010, the entire contents of which are hereby incorporated by reference.

BACKGROUND

The present disclosure herein relates to a semiconductor device and a method of fabricating the same, and more particularly, to a flash memory device including a charge storage structure and a gate, and a method of fabricating the same.

As the integration degree of a semiconductor memory device is improved, the critical dimension of a gate of a flash memory is gradually reduced. There is a limitation in that the electrical resistance of a gate increases as the critical dimension of the gate decreases. Accordingly, many studies are being conducted to overcome the above limitation.

SUMMARY

The present disclosure provides a semiconductor device including a gate having improved electrical resistance characteristics.

The present disclosure also provides a method of fabricating the semiconductor device.

The object is not limited to the aforesaid, but other objects not described herein will be clearly understood by those skilled in the art from descriptions below.

Embodiments disclosed herein provide semiconductor devices including: a charge storage structure on a substrate; and a gate on the charge storage structure, the gate including a lower portion formed of silicon and an upper portion formed of metal silicide, wherein the upper portion of the gate has a width greater than that of the lower portion of the gate.

A cross section of the gate may have a trapezoidal shape, tapering from an upper portion of the gate to a relatively wider lower portion. In some embodiments, the lower portion of the gate may have the same width.

In other embodiments, the upper portion of the gate may have a minimum width equal to or greater than a width of the lower portion of the gate.

In still other embodiments, the upper portion of the gate may have a thickness equal to or greater than a thickness of the lower portion of the gate.

In even other embodiments, the upper portion of the gate may include cobalt silicide (CoSix), nickel silicide (NiSix), molybdenum silicide (MoSix), titanium silicide (TiSix), tantalum silicide (TaSix), tungsten silicide (WSix), or a combination thereof.

In yet other embodiments, the semiconductor device may further include an interlayer dielectric filling a gap of a structure in which the charge storage structure and the gate are stacked.

In further embodiments, the interlayer dielectric may cover the lower portion of the gate and expose the upper portion of the gate.

In still further embodiments, the charge storage structure may include a tunnel dielectric layer, a floating gate, and a dielectric pattern.

In even further embodiments, the charge storage structure may include a first insulation layer, a charge trap pattern, and a second insulation pattern.

In other embodiments, methods of fabricating a semiconductor device include: forming a preliminary charge storage structure and a first conductive layer having silicon on a substrate; forming a charge storage structure and a second conductive pattern by etching the preliminary charge storage structure and the first conductive layer; forming a second conductive pattern including metal on an upper sidewall of the first conductive pattern; and forming a gate having an upper portion formed of metal silicide and a lower portion formed of silicon by performing silicidation on the first and second conductive pattern, wherein the upper portion of the gate has a width greater than a width of the lower portion of the gate, and has a trapezoidal shape having a greater width downward.

In some embodiments, the method may further include forming an interlayer dielectric filling a gap of a structure in which the charge storage structure and the first conductive pattern are stacked, wherein the interlayer dielectric covers a lower portion of the conductive pattern and exposes an upper portion of the conductive pattern.

In other embodiments, the forming of the second conductive pattern may include: conformally forming a second conductive layer including metal on the interlayer dielectric and the first conductive pattern; and anisotropically etching the second conductive layer to form the second conductive pattern.

In still other embodiments, the second conductive layer may include cobalt, nickel, molybdenum, titanium, tantalum, or a combination thereof.

In even other embodiments, the second conductive pattern may have an upper portion of a greater thickness than that of a lower portion thereof.

In yet other embodiments, the forming of the charge storage structure may include: forming a tunnel dielectric layer on the substrate; forming a third conductive pattern extending in a first direction on the tunnel dielectric layer; forming a dielectric layer on the third conductive pattern; and forming a dielectric pattern and a floating gate by etching the dielectric layer and the third conductive pattern in a second direction different from the first direction.

In further embodiments, the forming of the charge storage structure may include: forming a first insulation layer on the substrate; forming a charge trap layer on the first insulation layer; forming a second insulation layer on the charge trap layer; and forming a second insulation pattern and a charge trap pattern by etching the second insulation layer and the charge trap layer.

In still other embodiments, semiconductor devices include: a substrate including a first region and a second region; a memory device in the first region of the substrate, the memory device including a charge storage structure and a first gate; and a selection device in the second region of the substrate, the selection device including an insulation layer, a second gate and a source/drain region, wherein the first gate includes a lower portion formed of silicon and an upper portion formed of metal silicide, and the upper portion of the first gate has a width greater than that of the lower portion of the first gate and has a trapezoidal shape having a greater width downward.

In some embodiments, the second gate may include a lower portion formed of silicon and an upper portion formed of metal silicide, and the upper portion of the second gate may have a width greater than that of the lower portion of the second gate and have a trapezoidal shape having a greater width downward.

In other embodiments, the semiconductor device may further include an interlayer dielectric filling the memory device and the selection device, wherein the interlayer dielectric may cover the lower portions of the first and second gates and expose the upper portions of the first and second gates.

In still other embodiments, the upper portions of the first and second gates may have thicknesses equal to or greater than those of the lower portions of the first and second gates, respectively.

BRIEF DESCRIPTION OF THE DRAWINGS

The accompanying drawings are included to provide a further understanding of the examples provided herein, and are incorporated in and constitute a part of this specification. The drawings illustrate exemplary embodiments and, together with the description, serve to explain principles of these embodiments. In the drawings:

FIGS. 2N through 2O are cross-sectional views taken along lines x-x' and y-y' of FIG. 2M, respectively.

FIGS. 4A through 4K are cross-sectional views illustrating a method of fabricating a NAND flash memory device using the method of fabricating a semiconductor device shown in FIGS. 2A through 2M;

DETAILED DESCRIPTION OF THE EMBODIMENTS

Figure 1:
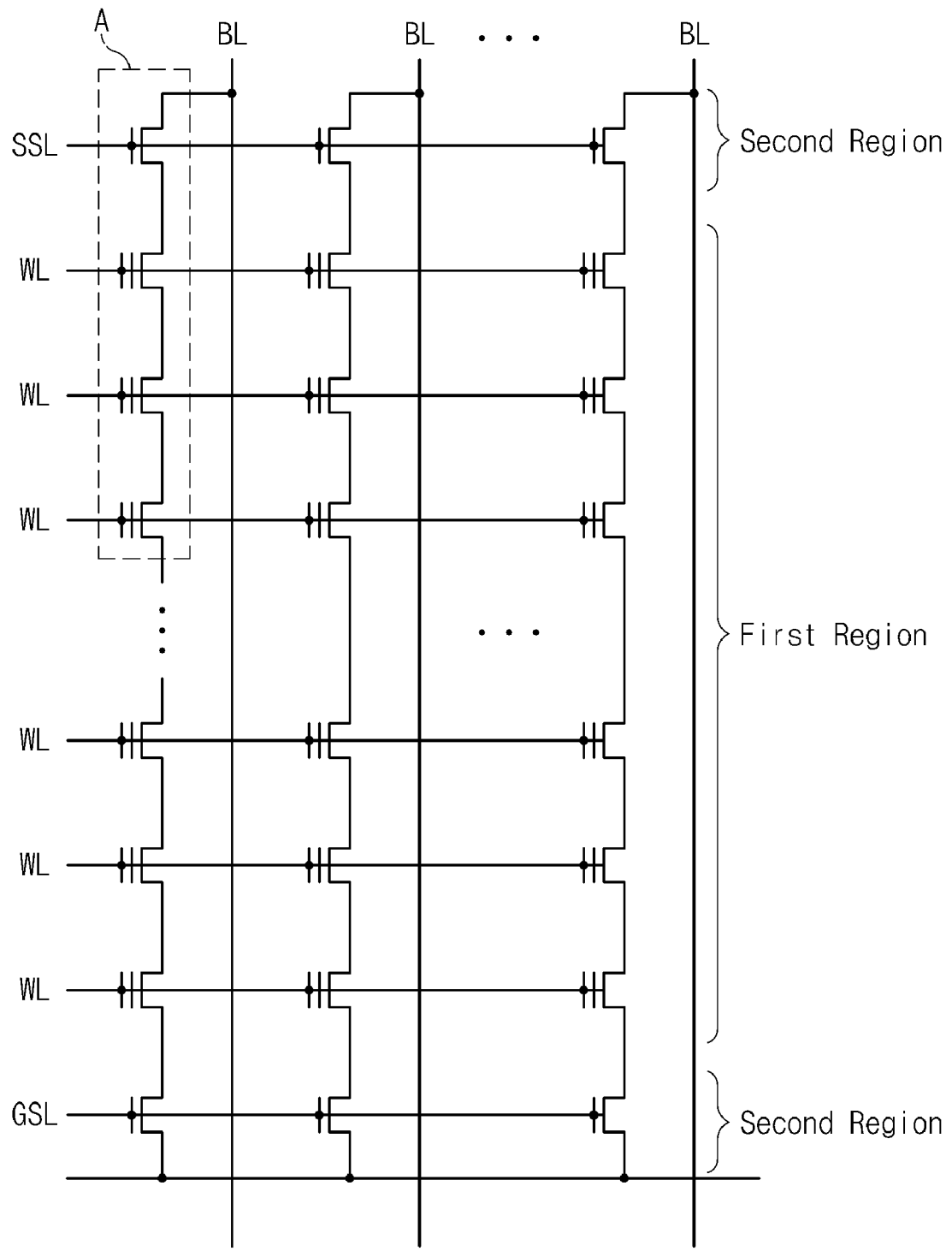
FIG. 1 is a circuit diagram illustrating a semiconductor device according to an exemplary embodiment.

The above-described objects, other objects, features, and advantages will be clarified through the exemplary embodiments described below. This technology may, however, be embodied in different forms and should not be construed as limited to the embodiments set forth herein. Modifications may be made to the disclosed embodiments without departing from the spirit and scope of the invention set forth in the claims below.

In the present disclosure, it will also be understood that when a component is referred to as being 'on' another component, it can be directly on the other component, or intervening components may also be present. In the figures, the dimensions of components are exaggerated for clarity of illustration.

Additionally, the embodiments in the detailed description will be described with sectional views and/or plan views as exemplary views. In the figures, the dimensions of layers and regions may be exaggerated for clarity of illustration. Accordingly, shapes of the exemplary views may be modified according to manufacturing techniques and/or allowable errors. Therefore, the embodiments are not limited to the specific shapes illustrated in the exemplary views, but may include other shapes that may be created according to manufacturing processes. For example, a right-angled etched area may have a rounded shape or a certain curvature. Areas exemplified in the drawings have general properties, and are used to illustrate a shape of a device region. However other shapes and areas are possible such that the illustrated shapes and areas should not be construed as limitations. Also, though terms like a first, a second, and the like are used to describe various components in various embodiments, the components are not limited to these terms. These terms are used only to discriminate one component from another component. Embodiments described and exemplified herein include complementary embodiments thereof.

In the following description, the technical terms are used only for explaining a specific exemplary embodiment and are not intended to be limitations. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

As used herein, the term "and/or" includes any and all combinations of one or more of the associated listed items. Also, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Hereinafter, exemplary embodiments will be described in detail with reference to the accompanying drawings.

(Memory Cell-First Embodiment)

FIG. 1 is a circuit diagram illustrating a semiconductor device according to an exemplary embodiment.

Referring to FIG. 1, a semiconductor device according to an exemplary embodiment may be a NAND flash memory device.

The NAND flash memory device may include a plurality of memory cells and selection lines. The plurality of memory cells may be disposed in a first region. The selection lines may be disposed in a second region at the both ends of the first region. The selection lines may include a string selection line SSL and a ground selection line GSL.

The semiconductor device may include a plurality of word lines WL and a plurality of bit lines BL.

The respective word lines WL may include a plurality of memory cells that are connected in series to each other. The respective word lines WL may be extended in one direction, and may be parallel to each other.

The bit line BL may include a plurality of memory cells, a string selection line SSL, and a ground selection line GSL that are connected in series to each other. The respective bit lines BL may be extended in a direction different from that of the word line WL, and may be parallel to each other. For example, the word lines WL and the bit lines BL may be perpendicular to each other.

Figure 2A:
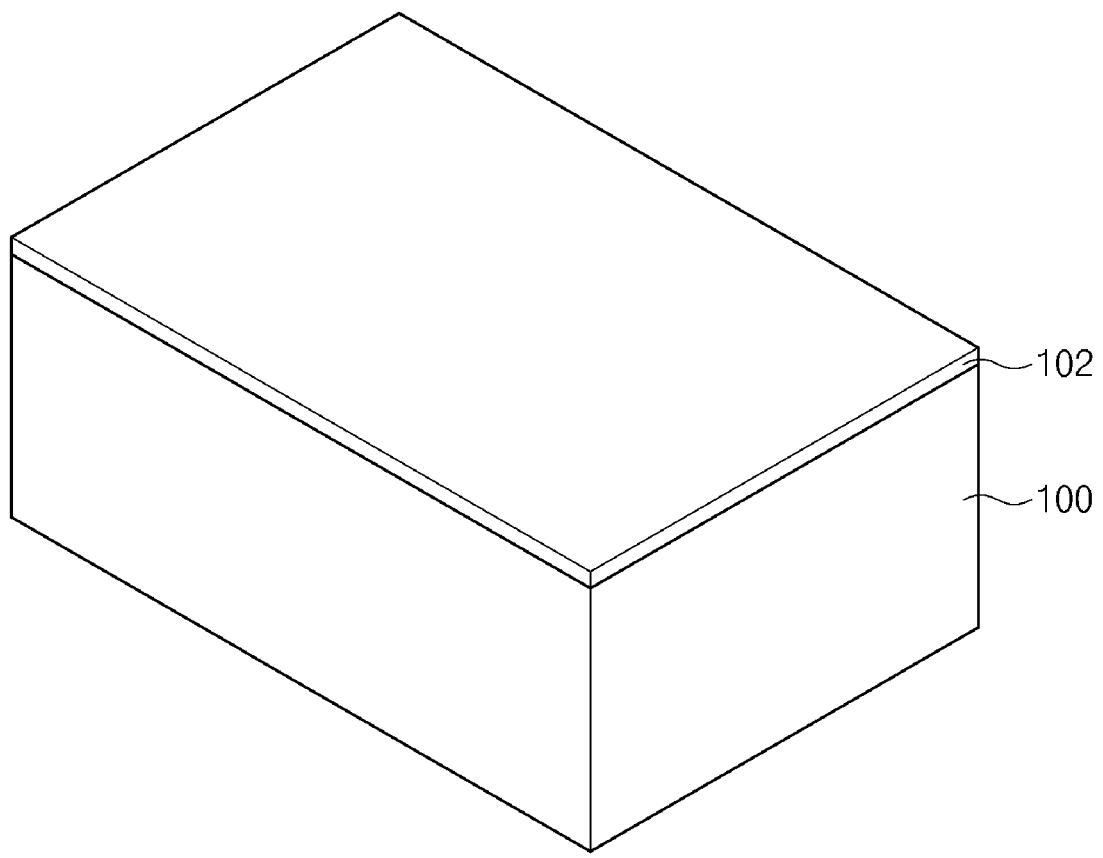
FIGS. 2A through 2M are perspective views illustrating a method of fabricating a semiconductor device according to an exemplary embodiment.

FIGS. 2A through 2M are perspective views illustrating a method of fabricating a semiconductor device according to an exemplary embodiment. FIGS. 2N and 2O are cross-sectional views taken along lines x-x' and y-y' of FIG. 2M, respectively.

According to an exemplary embodiment, the semiconductor device shown in FIGS. 2A through 2M may include a memory cell of a NAND flash memory device. According to this embodiment, the memory cell may have a structure including a floating gate and a control gate.

Referring to FIG. 2A, a tunnel dielectric layer 102 may be formed on a substrate 100.

The substrate 100 may include a semiconductor substrate such as a silicon (Si) substrate, a germanium (Ge) substrate, and a silicon-germanium (Si—Ge) substrate, a silicon-on-insulator (SOI) substrate, a germanium-on-insulator (GOI) substrate, and a silicon-germanium-on-insulator (SGOI) substrate.

Although not shown in detail, the substrate 100 may include an active region that is limited to a field region. The field region may be formed by a shallow trench isolation process. Also, the field region may include oxide, nitride, or oxynitride. For example, the field region may include silicon oxide, silicon nitride, or silicon oxynitride.

The tunnel dielectric layer 102 may include oxide, for example, silicon oxide. The tunnel dielectric layer 102 may be formed by a chemical vapor deposition (CVD) process, an atomic layer deposition (ALD) process, or a thermal oxidation process.

Figure 2B:
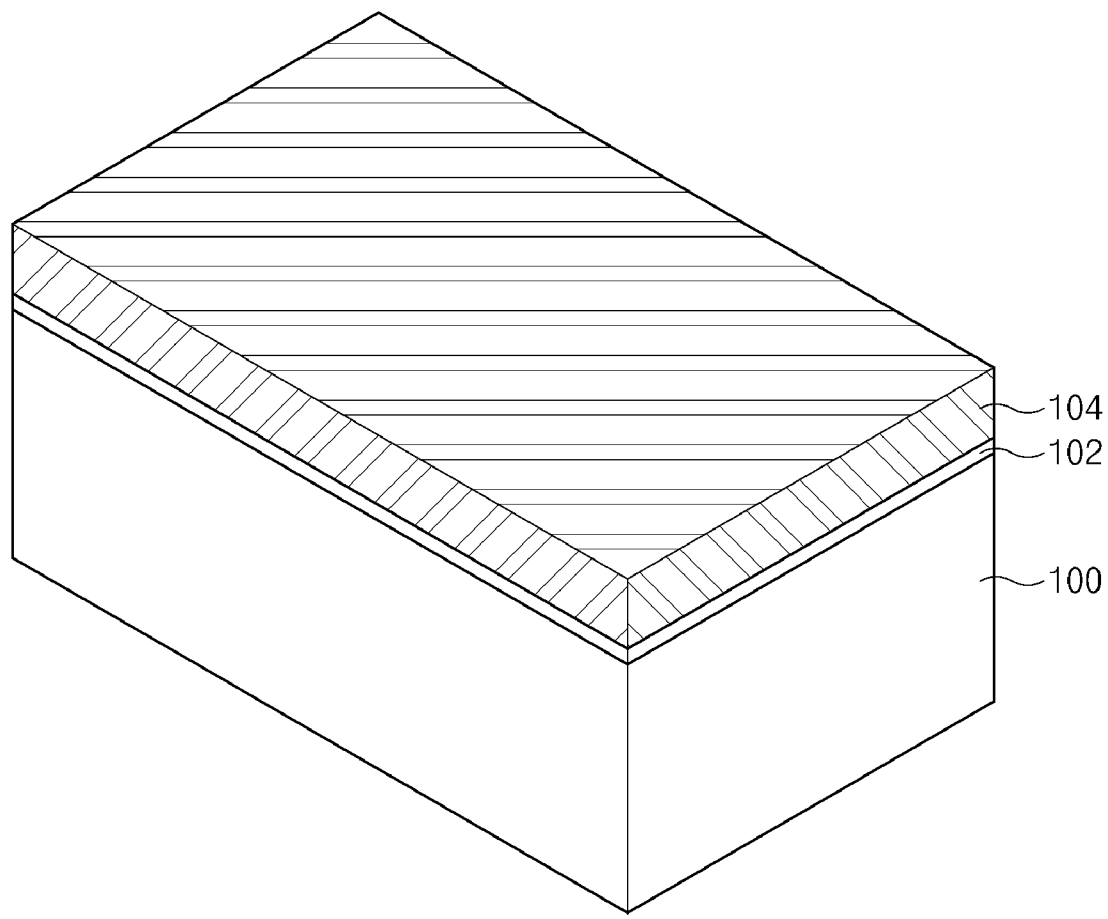

Referring to FIG. 2B, a first conductive layer 104 may be formed on the tunnel dielectric layer 102.

The first conductive layer 104 may include silicon doped with impurities, metal, metal compound, or a combination thereof. For example, when the first conductive layer 104 includes silicon doped with impurities, the first conductive layer 104 may be formed by a low-pressure chemical vapor deposition process. The doping of impurities may be performed by diffusion, ion implantation, or an in-situ doping process.

Figure 2C:
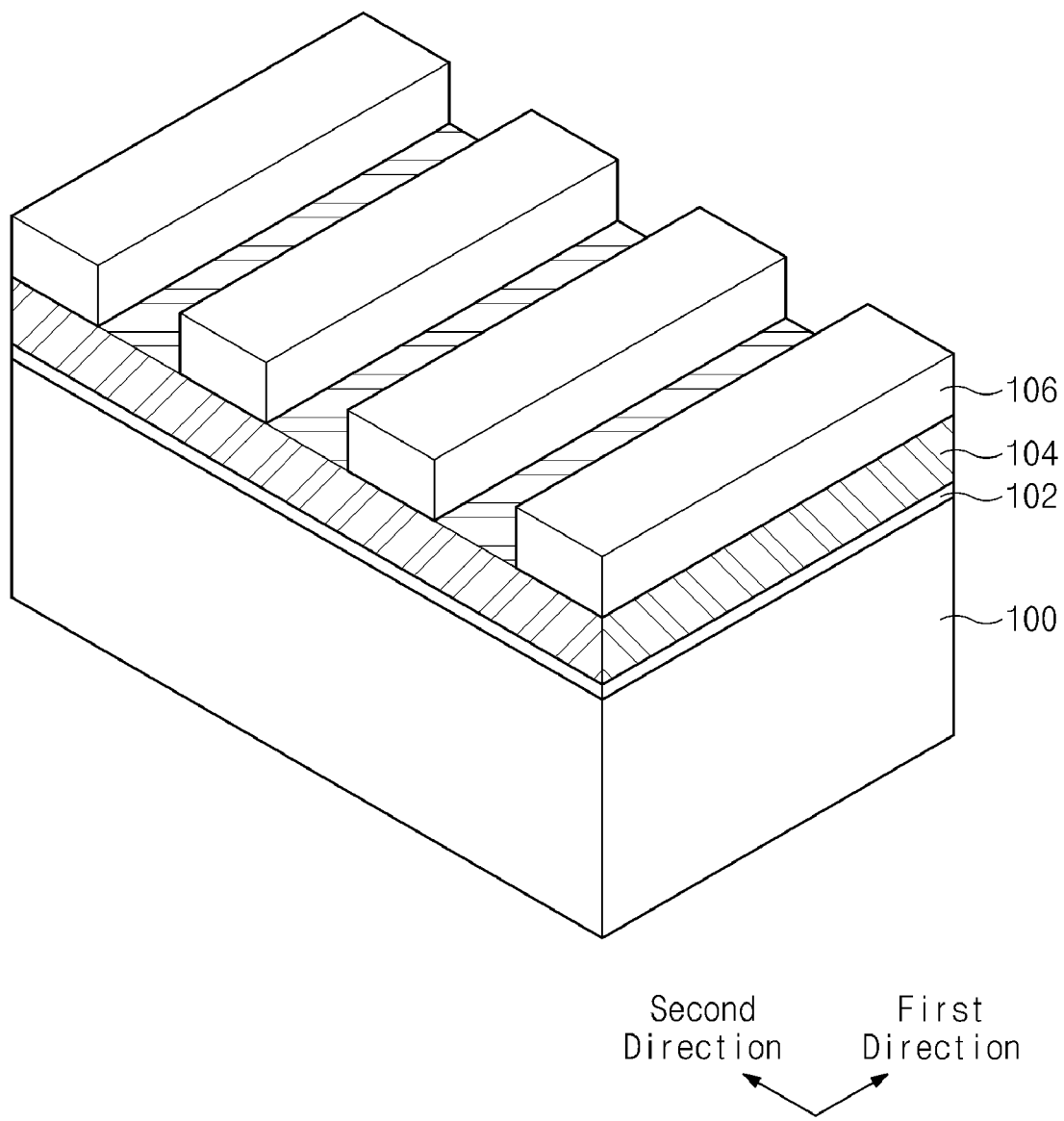

Referring to FIG. 2C, a first mask 106 may be formed on the first conductive layer 104.

More specifically, a first mask layer (not shown) may be formed. The first mask layer may include nitride, for example, silicon nitride. A photoresist pattern (not shown) may be formed on the first mask layer. The first mask layer may be etched using the photoresist pattern as an etch mask to form the first mask 106. After the first mask 106 is formed, the photoresist pattern may be removed by an ashing process and a strip process.

Figure 2D:
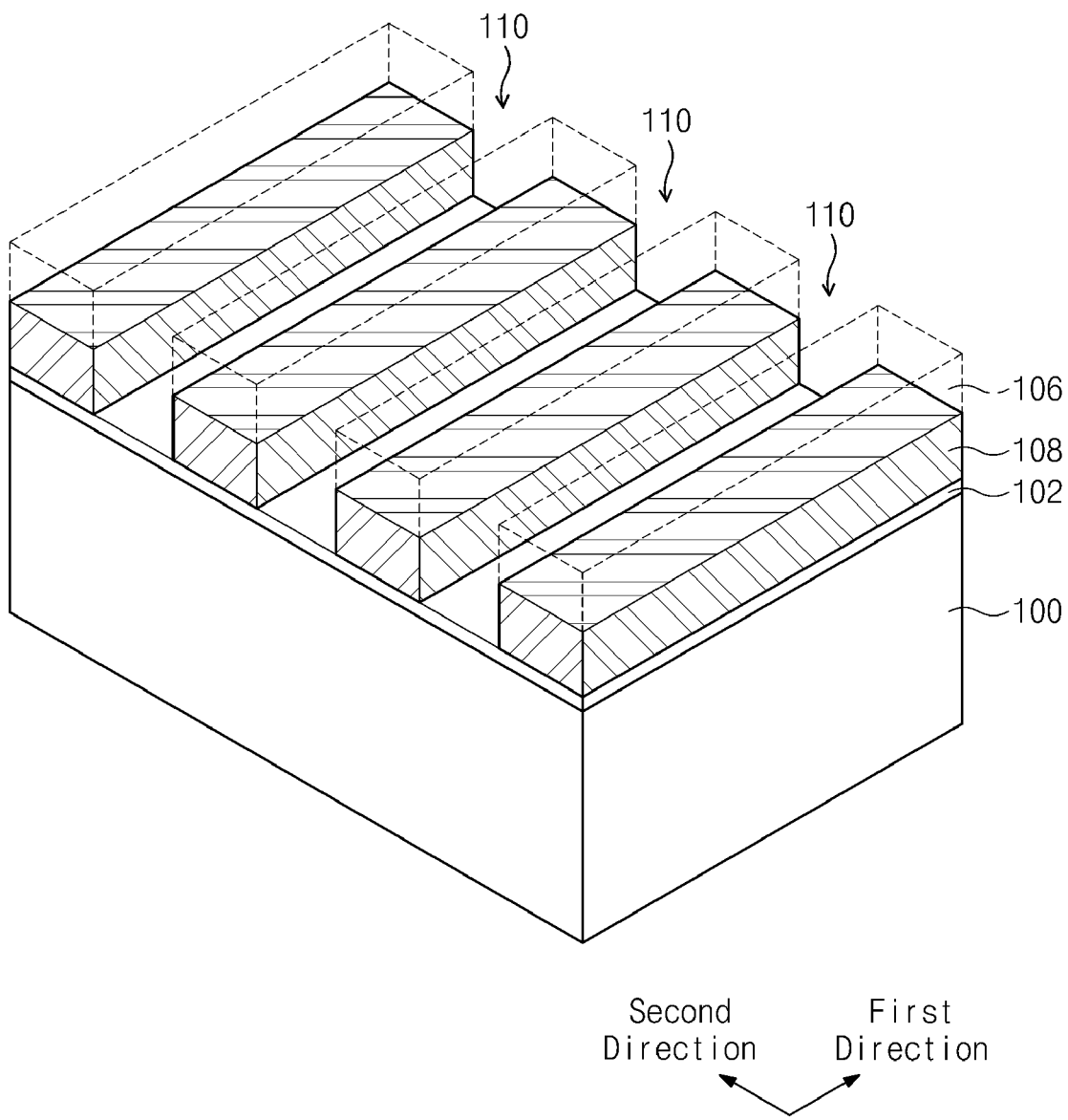

The first mask 106 may have a line shape extending in a first direction. Referring to FIG. 2D, a first conductive pattern 108 may be formed by an etching process using the first mask 106.

More specifically, the first conductive layer (104 of FIG. 2C) may be etched by an anisotropic etching process using the first mask 106. The anisotropic etching process may include a plasma etching process or a Reactive Ion Etching (RIE). As a result of the anisotropic etching process, the first conductive pattern 108 may be formed.

The first conductive pattern 108 may have a line shape extending in the same first direction as the first mask 106.

According to some embodiments, when there are a plurality of the first conductive patterns 108, the plurality of first conductive patterns 108 may be spaced from each other at the same interval, and may be disposed parallel to each other. Also, a plurality of first openings 110 may be formed between the plurality of first conductive patterns 108.

After the first conductive pattern 108 is formed, the first mask 106 may be removed.

Figure 2E:
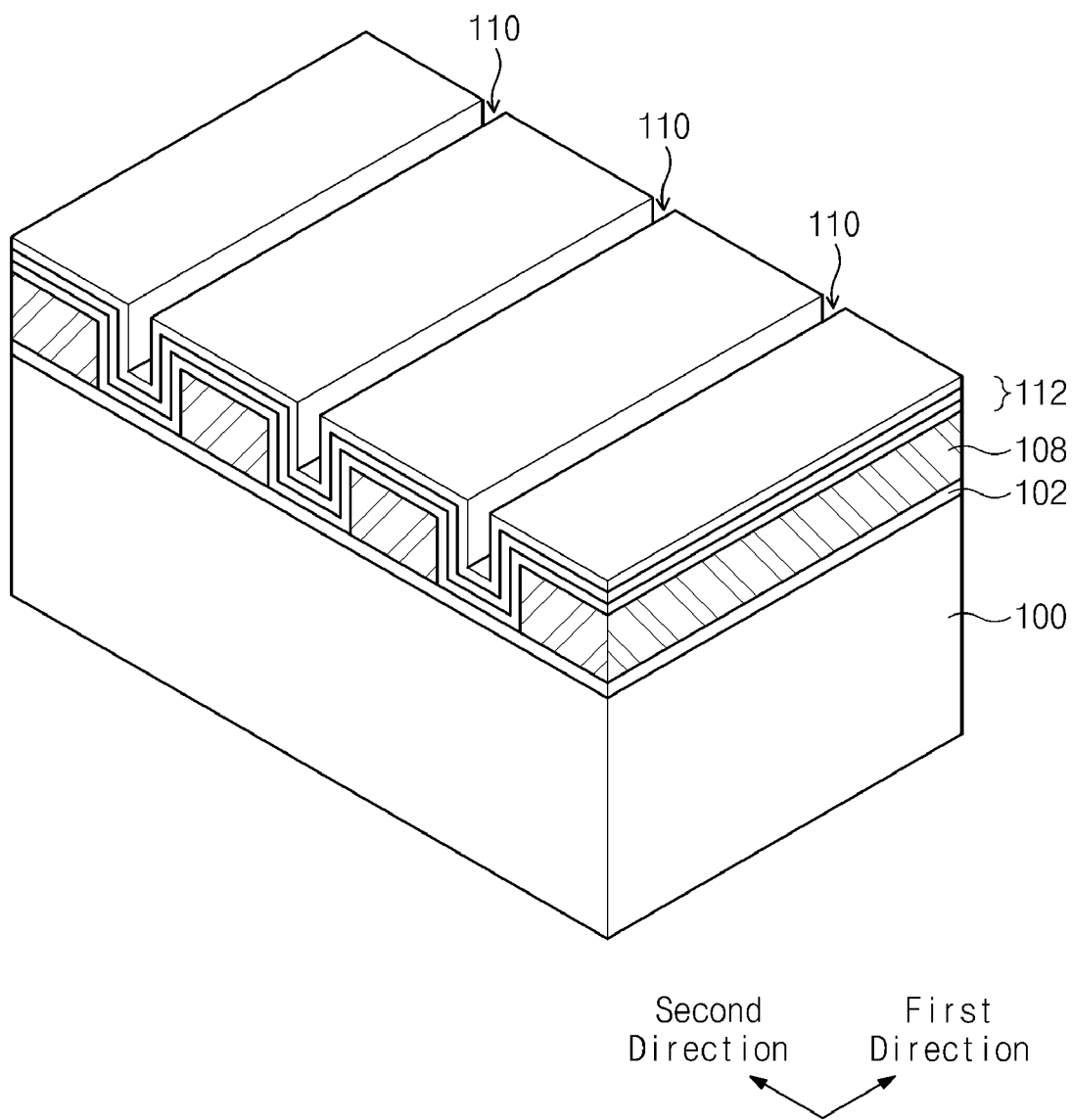

Referring to FIG. 2E, a dielectric layer 112 may be conformally formed on the first conductive pattern 108 and the tunnel dielectric layer 102.

The dielectric layer 112 may be continuously formed along the surface profile of the first conductive pattern and the tunnel dielectric layer 102, and may be formed not to completely fill the first openings 110.

According to an exemplary embodiment, the dielectric layer 112 may have a multi-layer structure in which a first oxide layer, a nitride layer, and a second oxide layer are stacked. The first and second oxide layers and the nitride layer may include silicon oxide and silicon nitride, respectively.

According to another exemplary embodiment, the dielectric layer 112 may include metal oxide having a higher dielectric constant than silicon oxide. Examples of metal oxides may include tantalum oxide (TaOx), titanium oxide (TiOx), hafnium oxide (HfOx), zirconium oxide (ZrOx), aluminum oxide (AlOx), yttrium oxide (YOx), cesium oxide (CsOx), indium oxide (InOx), lanthanum oxide (LaOx), strontium titan oxide (ScTiOx), lead titanium oxide (PbTiOx), strontium ruthenium oxide (ScRuOx), calcium ruthenium oxide (CaRuOx), aluminum nitride oxide (AlNxOy), hafnium silicate (HfSiOy), zirconium silicate (ZrSixOy), hafnium nitride silicate (HfNxSiyOx), zirconium nitride silicate (ZrNxSiyOx), and hafnium aluminate (HfAlOx). The dielectric layer 112 may be formed of one of the above-enumerated materials or a combination thereof.

Figure 2F:
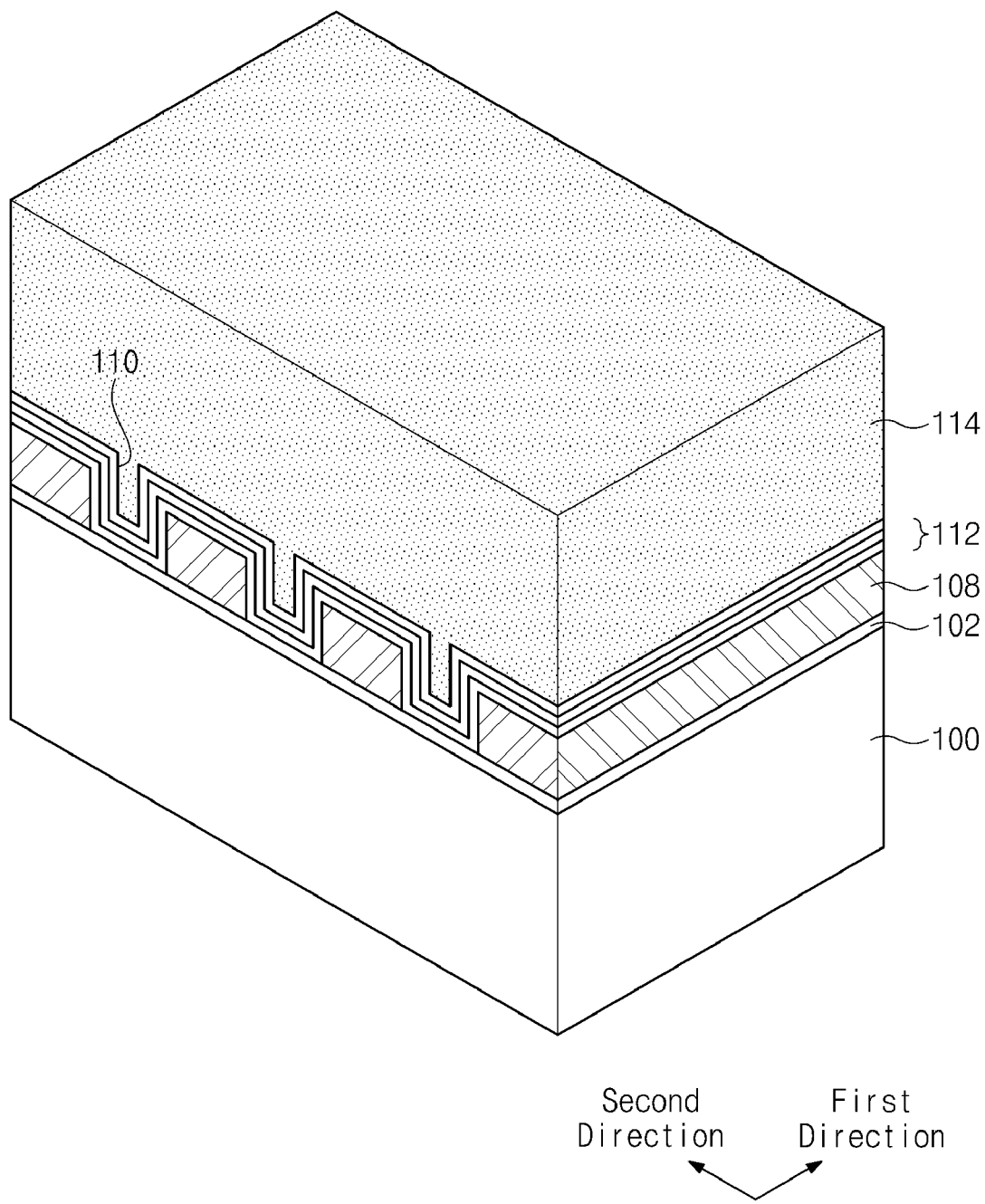

Referring to FIG. 2F, a second conductive layer 114 may be formed on the dielectric layer 112.

The second conductive layer 114 may be formed to fill the first opening 110 in which the dielectric layer 112 is formed. According to some embodiments, the second conductive layer 114 may include polysilicon doped with impurities. In this case, the second conductive layer 114 may be formed by a low pressure chemical vapor deposition process. The doping of impurities may be performed by diffusion, ion implantation, or an in-situ doping process. Alternatively, in place of polysilicon could be used amorphous silicon or a combination of poly and amorphous silicon. In addition to Si, other useful semiconductor materials can be used, such as other semiconductor elements, or compounds comprising or forming semiconductors, including various silicides, carbides and germanides. Examples include those elements from Group IV of the Periodic Table, including Si, C, or Ge, or alloys of these such as SiC or SiGe; Group II-VI compounds (including binary, ternary, and quaternary forms), e.g., compounds formed from Group II materials such as Zn, Mg, Be or Cd and Group VI materials such as Te, Se or S, such as ZnSe, ZnSTe, or ZnMgSTe; and Group III-V compounds (including binary, ternary, and quaternary forms), e.g., compounds formed from Group III materials such as In, Al, or Ga and group V materials such as As, P, Sb or N, such as InP, GaAs, GaN, InAlAs, AlGaN, InAlGaAs, etc. Conductive layer 114 could also be formed of a metal, or a conductive metal compound or alloy. While the description of many embodiments disclosed herein reference an exemplary polysilicon/silicide structured word line, the structure for all embodiments described herein, including shapes, sizes, relative sizes, etc., may be equally applicable to other materials. For example, for all embodiments disclosed, contemplated alternative embodiments include use of an alternative semiconductor in place of (or in addition to) polysilicon and/or use of an alternative semiconductor-metal compound in place of (or in addition to) silicide, including those semiconductor and semiconductor-metal compounds referenced here.

Figure 2G:
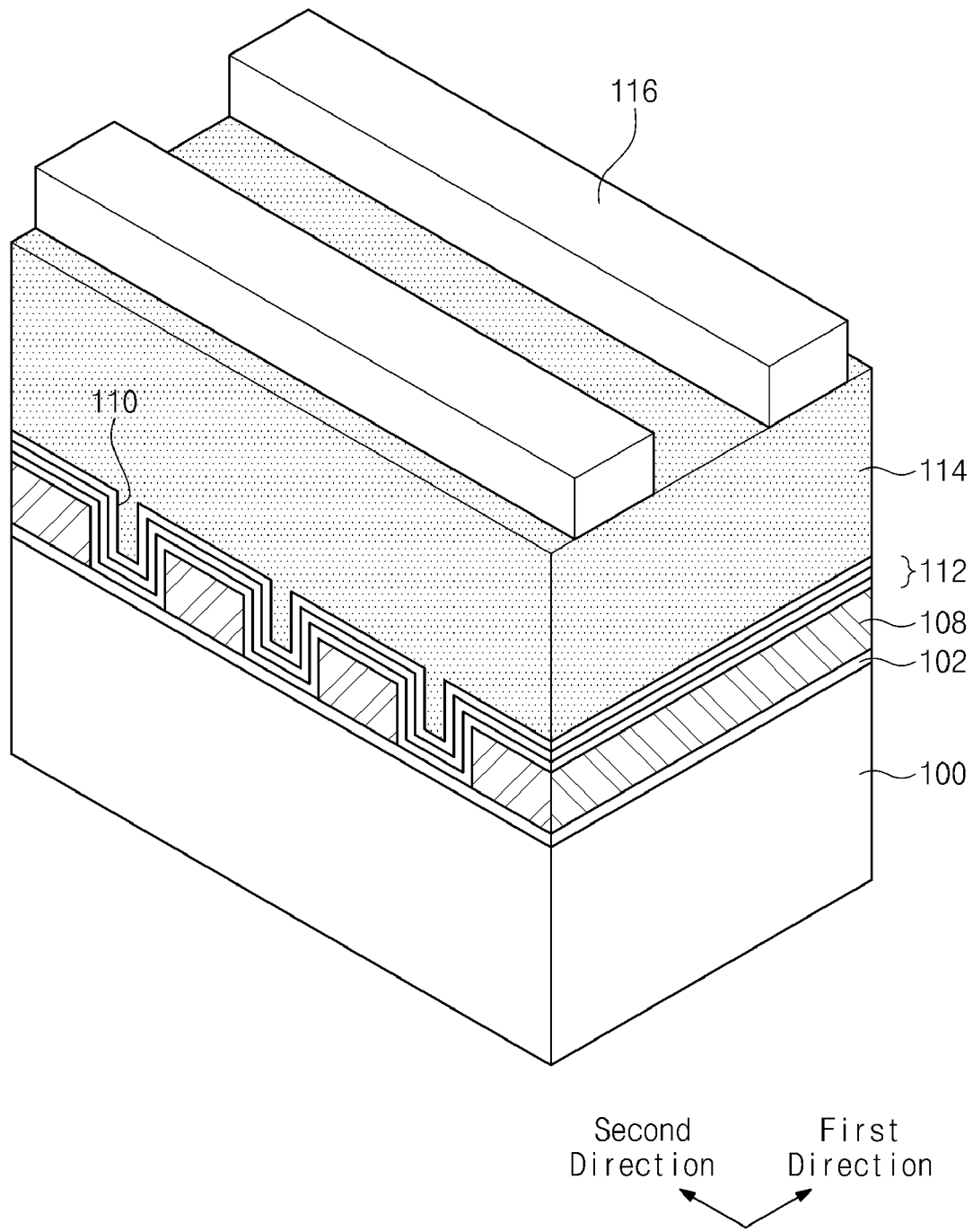

Referring to FIG. 2G, a second mask 116 may be formed on the second conductive layer 114.

According to some embodiments, the second mask 116 may have a line shape extending in a second direction substantially different from the first direction. For example, the second direction may be perpendicular to the first direction.

The second mask 116 may be a hard mask, and include nitride, for example, silicon nitride. If the second mask 116 is a hard mask, it may be formed by depositing a hard mask material layer (e.g., nitride) and patterning the hard mask layer via a patterned photoresist material formed on the hard mask material layer, the patterned photoresist material may be subsequently removed. Alternatively, the second mask 116 may be photoresist.

Figure 2H:
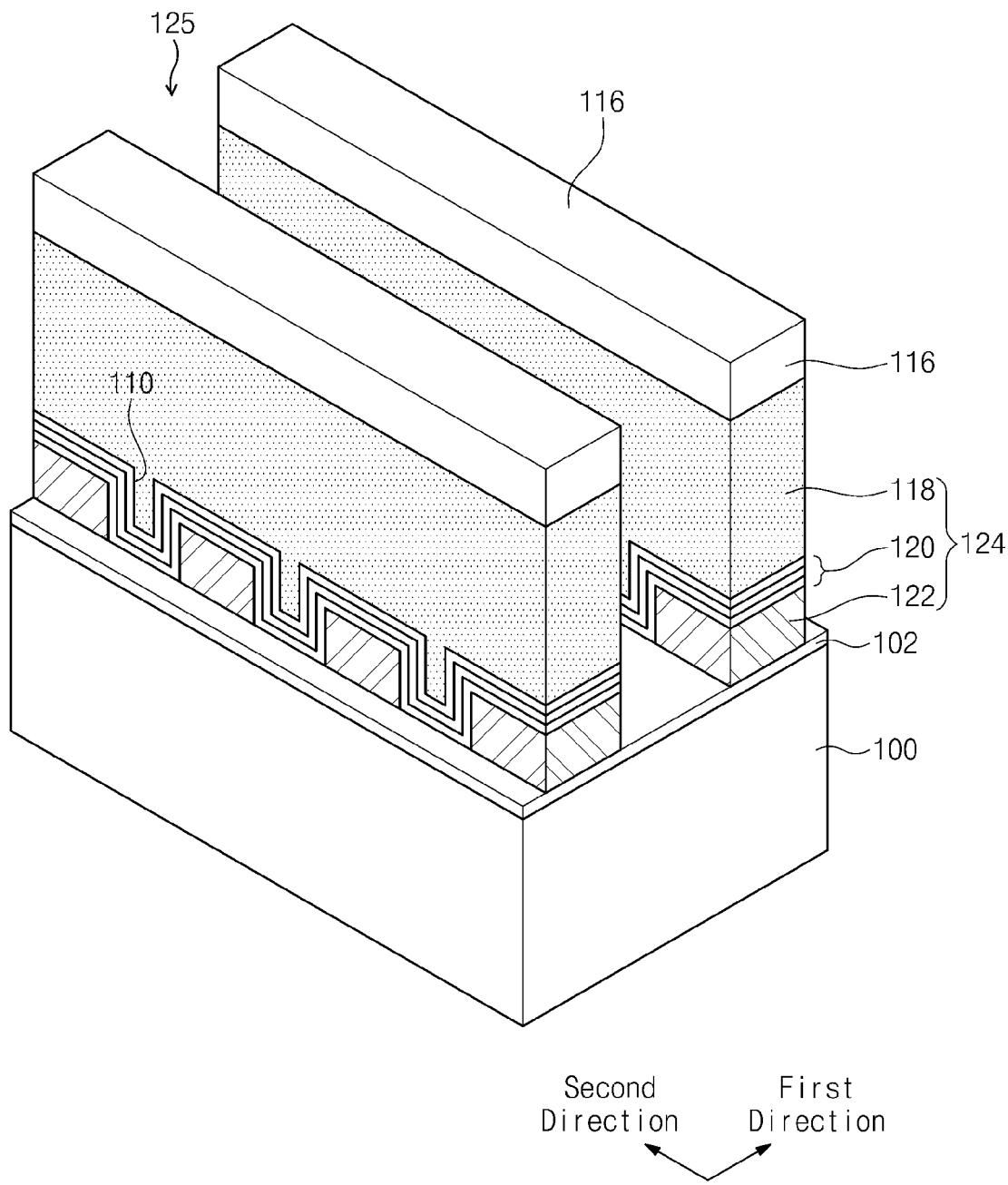

Referring to FIG. 2H, a second conductive pattern 118, a dielectric pattern 120, and a floating gate 122 may be formed by an etching process using the second mask 116.

More specifically, the second conductive layer (114 of FIG. 2G), the dielectric layer (112 of FIG. 2G), and the first conductive pattern (108 of FIG. 2G) may be etched by an anisotropic etching process using the second mask 116. The examples of the anisotropic etching processes may include a plasma etching process and an active ion etching process.

As a result of the anisotropic etching, a preliminary unit cell 124 including the floating gate 122, the dielectric pattern 120, and the second conductive pattern 118 may be formed on the tunnel dielectric layer 102. The floating gate 122 may be formed on the tunnel dielectric layer 102 to have a hexahedral structure. The dielectric pattern 120 may be formed on the floating gate 122 to extend in the second direction. The second conductive pattern 118 may be formed on the dielectric pattern 120 to extend in the second direction.

Also, when a plurality of the preliminary unit cell 124 are formed, a second opening 125 may be formed between rows of the plurality of preliminary unit cells 124 as exemplified by FIG. 2H.

Figure 2I:
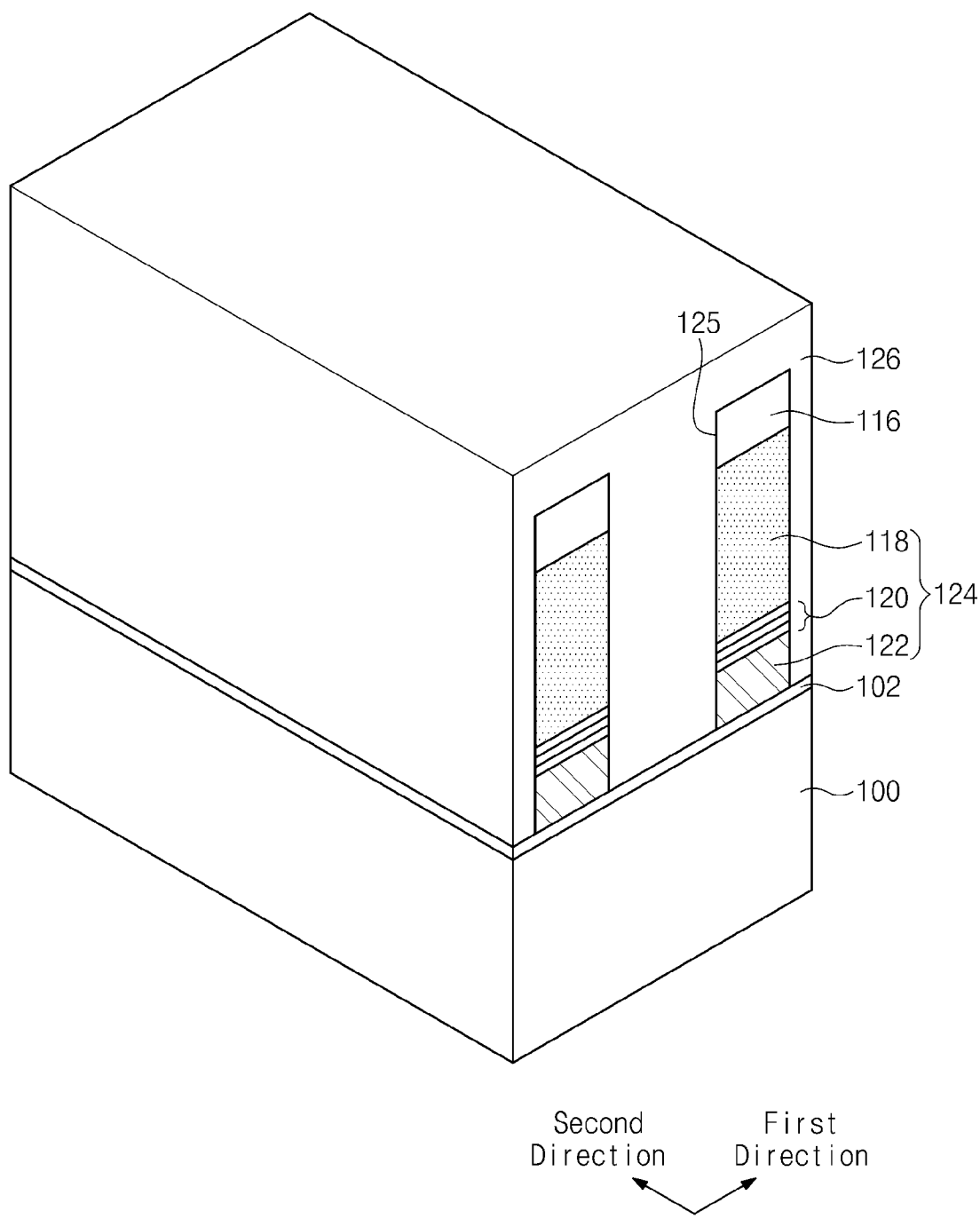

Referring to FIG. 2I, an interlayer dielectric 126 may be formed on the preliminary unit cell 124.

The interlayer dielectric 126 may be form on the preliminary unit cell 124 to fill the second opening 125.

The interlayer dielectric 126 may include oxide, nitride, or oxynitride, each of which may include silicon oxide, silicon nitride, or silicon oxynitride.

Figure 2J:
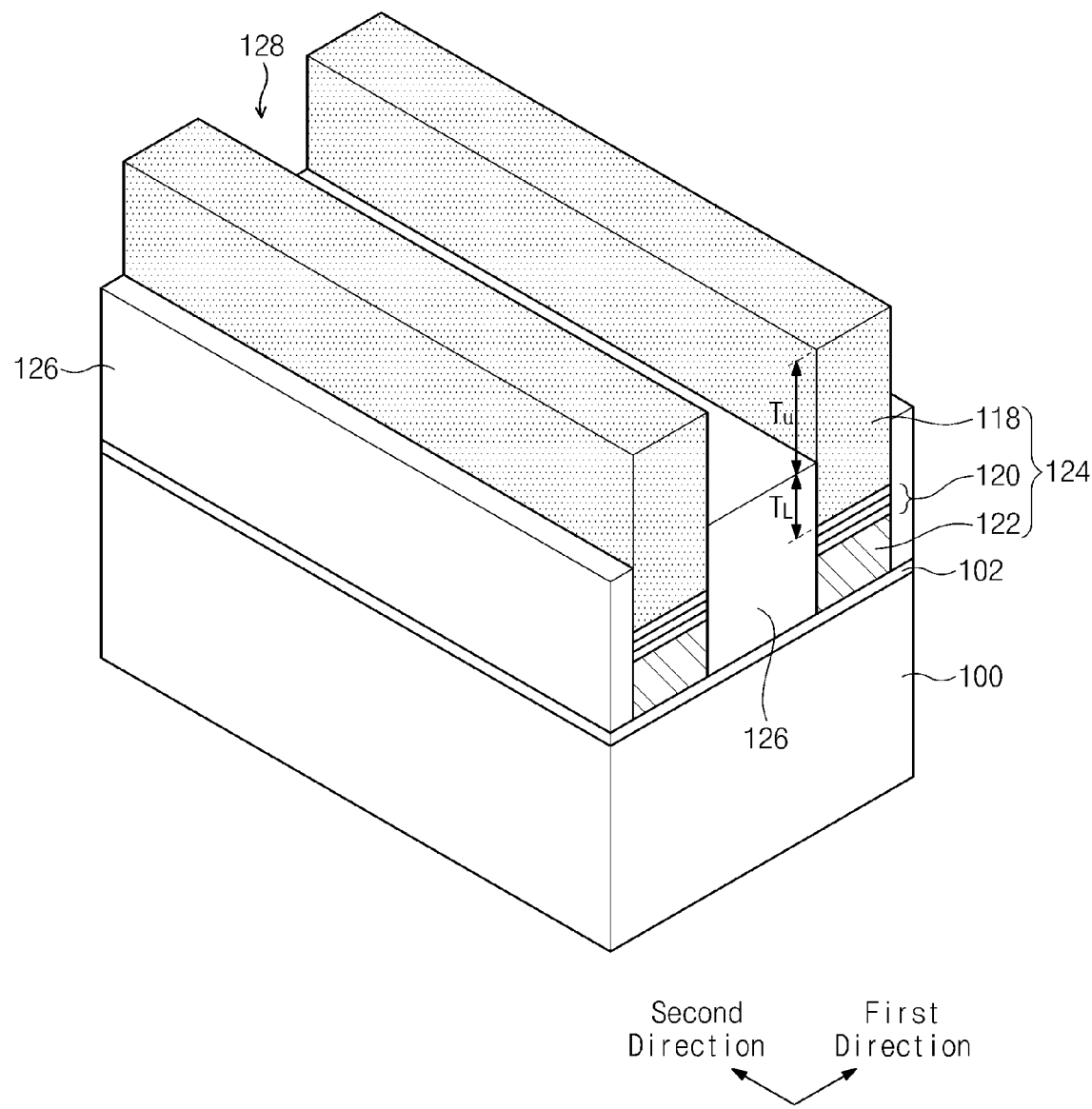

Referring to FIG. 2J, an upper portion of the second conductive pattern 118 may be exposed by partially etching the interlayer dielectric 126.

While the interlayer dielectric 127 is being etched, the second mask (116 of FIG. 2I) may be removed.

More specifically, when the interlayer dielectric 126 includes oxide, and the second mask 116 includes nitride, an upper portion of the interlayer dielectric 126 may be etched until the upper surface of the second mask 116 is exposed. This initial etch may be performed by chemical-mechanical polishing (CMP), for example. The etching of the upper portion of the interlayer dielectric 126 remaining after the CMP may continue with an etch back process. During the etch back process, the second mask 116 may be removed such that the upper portion of the second conductive pattern 118 is exposed. While the second mask 116 is being removed, the interlayer dielectric 126 located at the same level as the second mask 116 may be etched. The interlayer dielectric 126 may be continuously etched past the level of the second mask 116 to expose the upper portion of the second conductive pattern 118 so that it protrudes from the interlayer dielectric layer 126. Alternative etching processes to achieve a similar result will be apparent to one of ordinary skill. For example, the above described CMP etching may be performed to remove the second mask 116, stopping when the top surface of the second conductive pattern 118 is exposed, after which the above described etch back process may be performed. Alternatively, a CMP step may be eliminated entirely and a single etch (e.g., a wet etch process) may be used to remove the second mask 116 and perform the etch back process such that the upper portion of the second conductive pattern 118 protrudes from the interlayer dielectric layer 126. As yet another alternative, the second mask 116 may be removed prior to depositing interlayer dielectric layer 126.

The thickness $T_U$ of the upper portion of the second conductive pattern 118 exposed by the etching of and protruding above the interlayer dielectric 126 may be substantially equal to, or greater than the thickness $T_L$ of a lower portion of the second conductive pattern 118 below the top surface the interlayer dielectric 126 (adjacent the conductive pattern 118). For example, In some embodiments, when there is a plurality of second conductive patterns 118, a third opening 128 may be formed between the second conductive patterns 118. The interlayer dielectric 126 may be exposed at the bottom of the third opening 128.

Figure 2K:
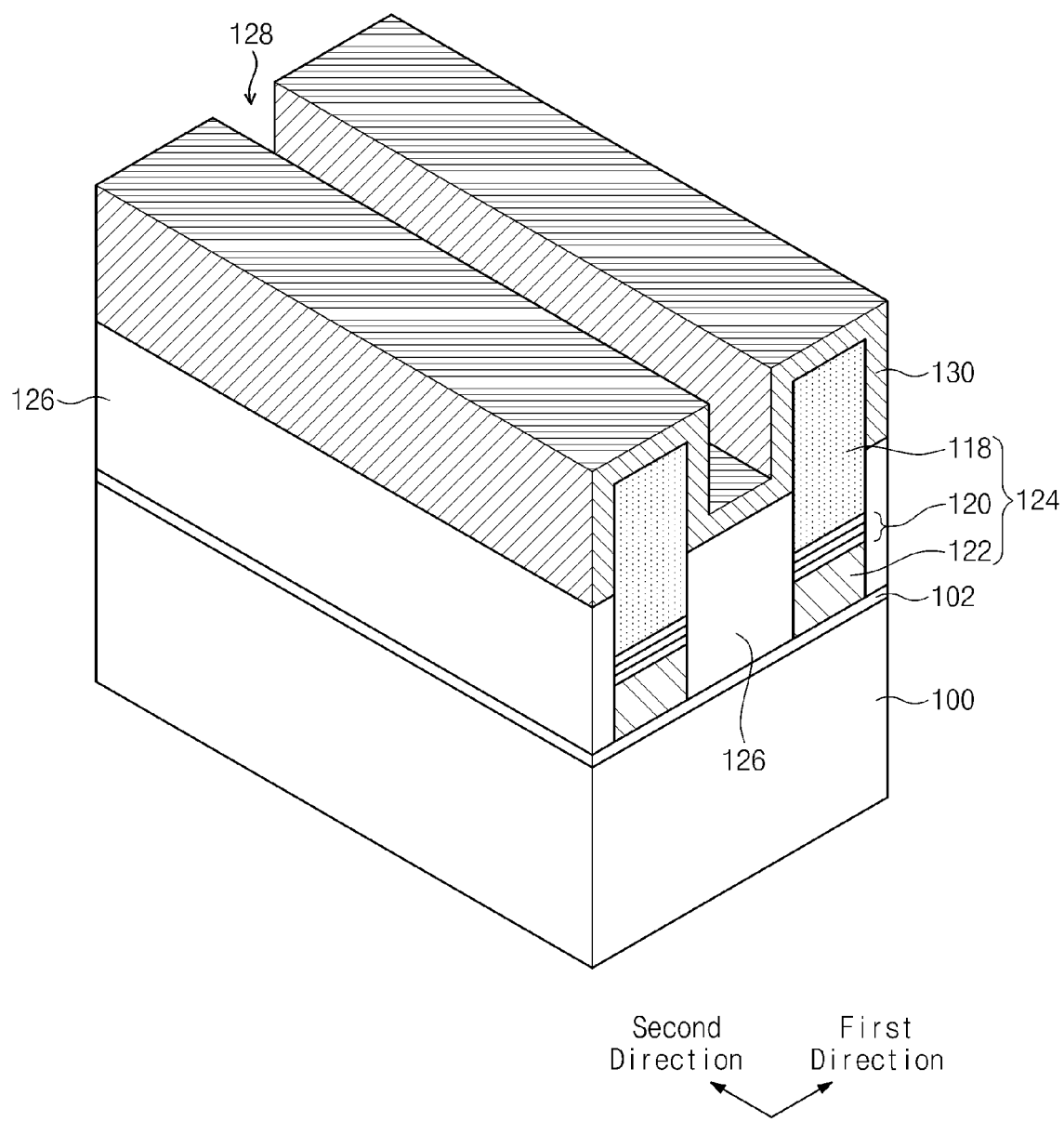

Referring to FIG. 2K, a third conductive layer 130 may be conformally formed on the interlayer dielectric 126 and the second conductive pattern 118.

The third conductive layer 130 may be continuously formed along a surface profile of the interlayer dielectric 126 and the second conductive pattern 118. Also, the third conductive layer 130 may be formed not to completely fill the third opening 128.

The third conductive layer 130 may include metal or metal compound. For example, the third conductive layer 130 may include Ti, Ta, Ni, Co, Mo, W, or a combination thereof. The third conductive layer 130 may be a refractory metal.

Figure 2L:
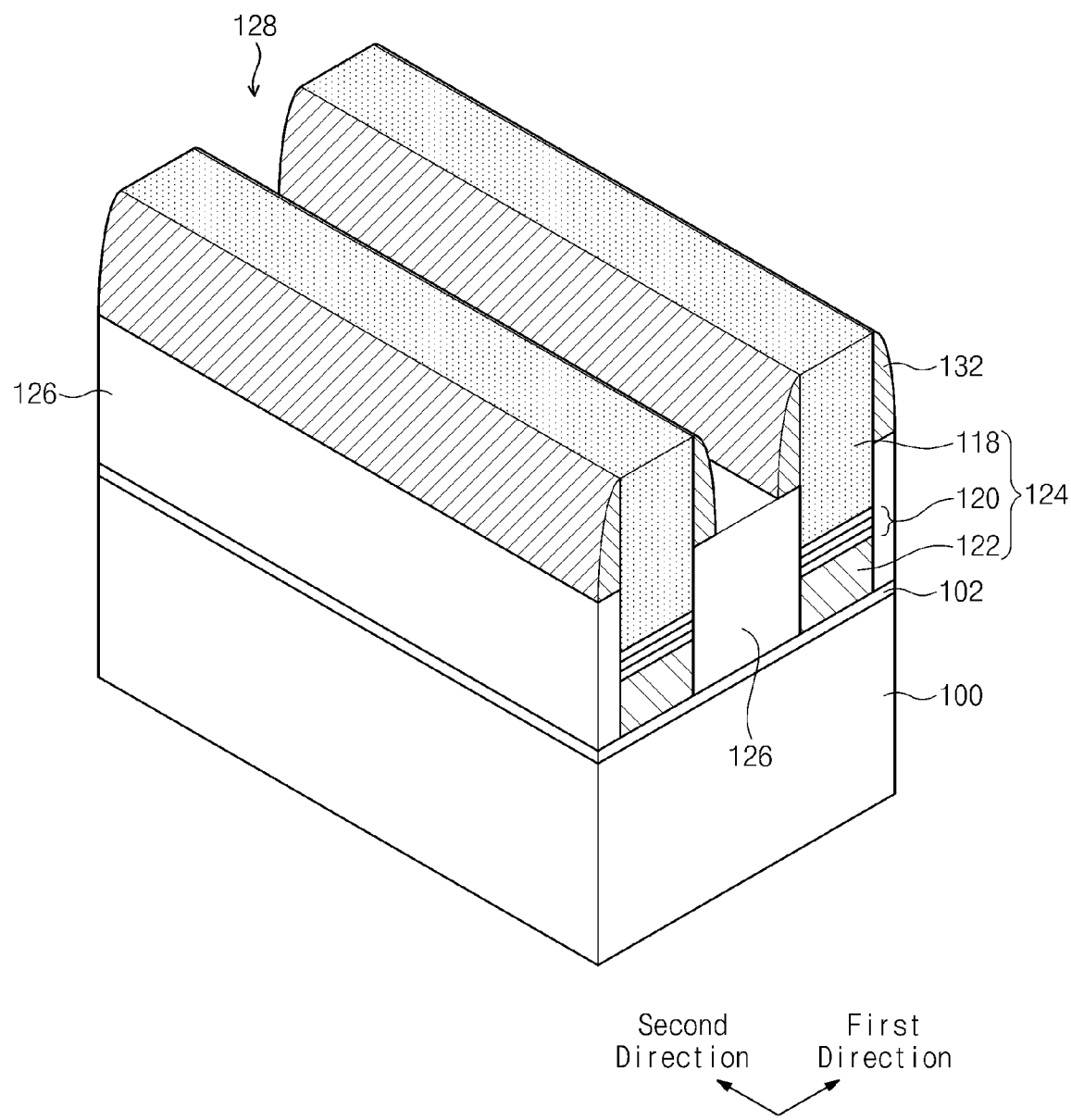

Referring to FIG. 2L, a third conductive pattern 132 may be formed on the sidewall of the second conductive pattern 118 by etching the third conductive layer (130 of FIG. 2K).

More specifically, an anisotropic etching process may be performed on the third conductive layer 130. The third conductive layer 130 formed on the conductive pattern 118 and the conductive layer 130 formed at the bottom of the third opening 128 may be selectively etched. Plasma etching is one example of this anisotropic etching.

As a result of the anisotropic etching, the third conductive pattern 132 may be formed on the sidewall of the second conductive pattern 118. The third conductive pattern 132 may have a sloped sidewall, such that the width of bottom portion of the conductive pattern 132 is larger than the upper portion of the conductive pattern 132. The inner sidewall of the third conductive pattern 132 may be vertical.

Figure 2M:
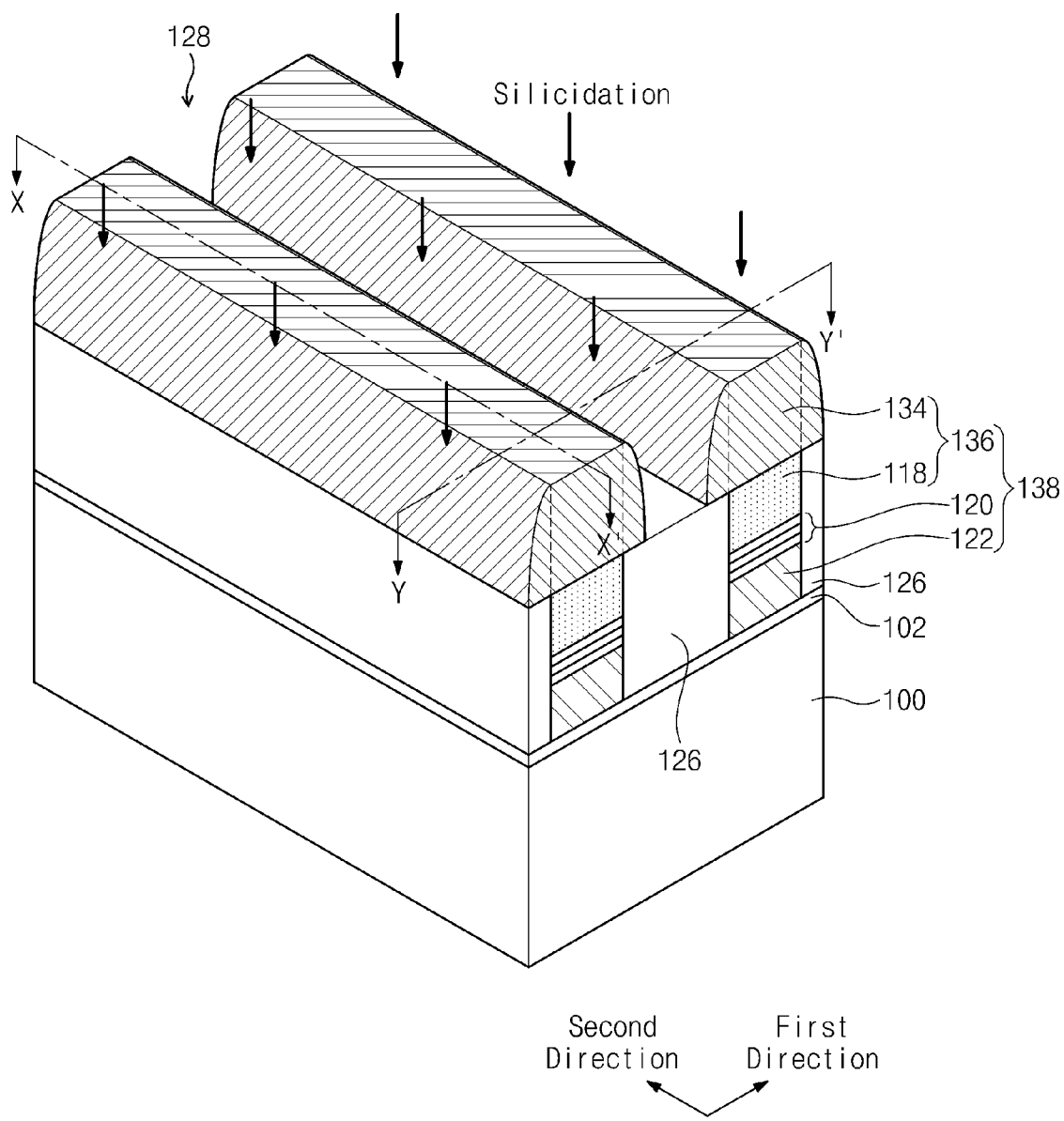
Figure 2N:
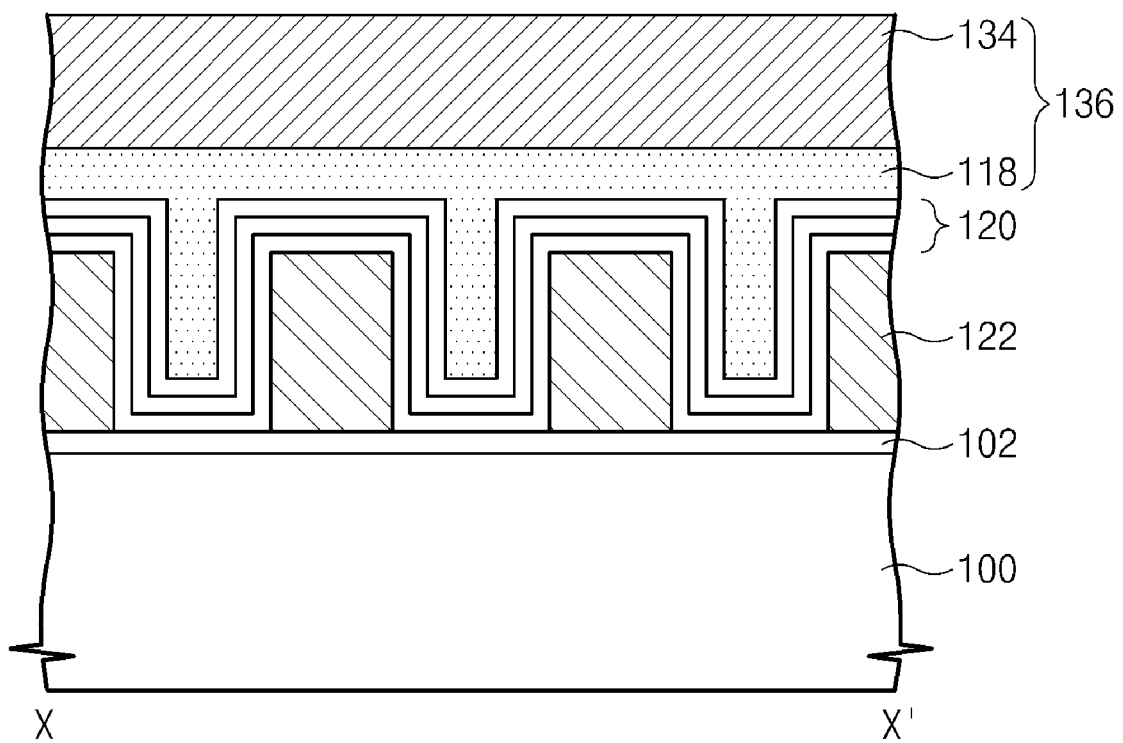
Figure 20:
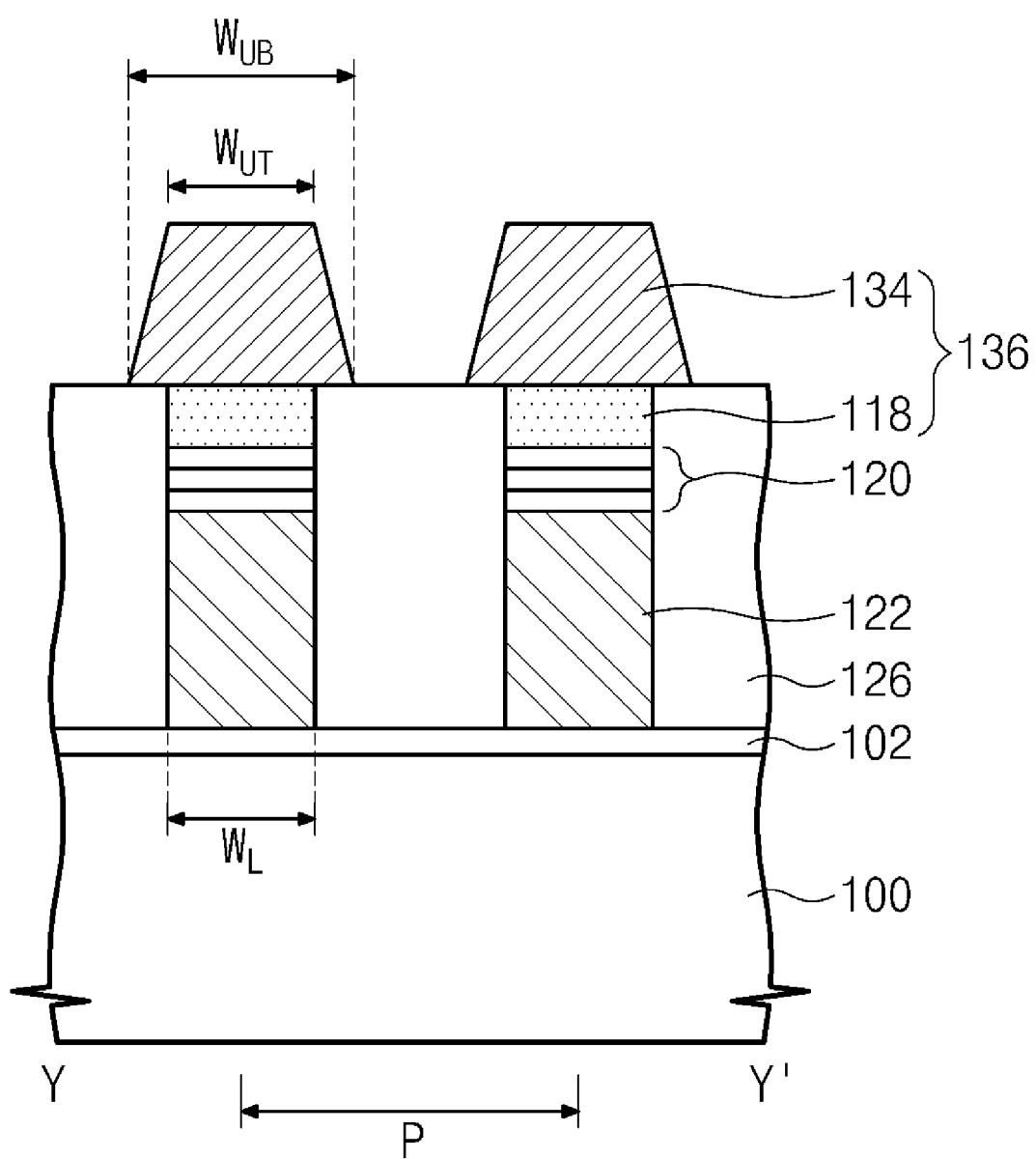
Figure 2P:
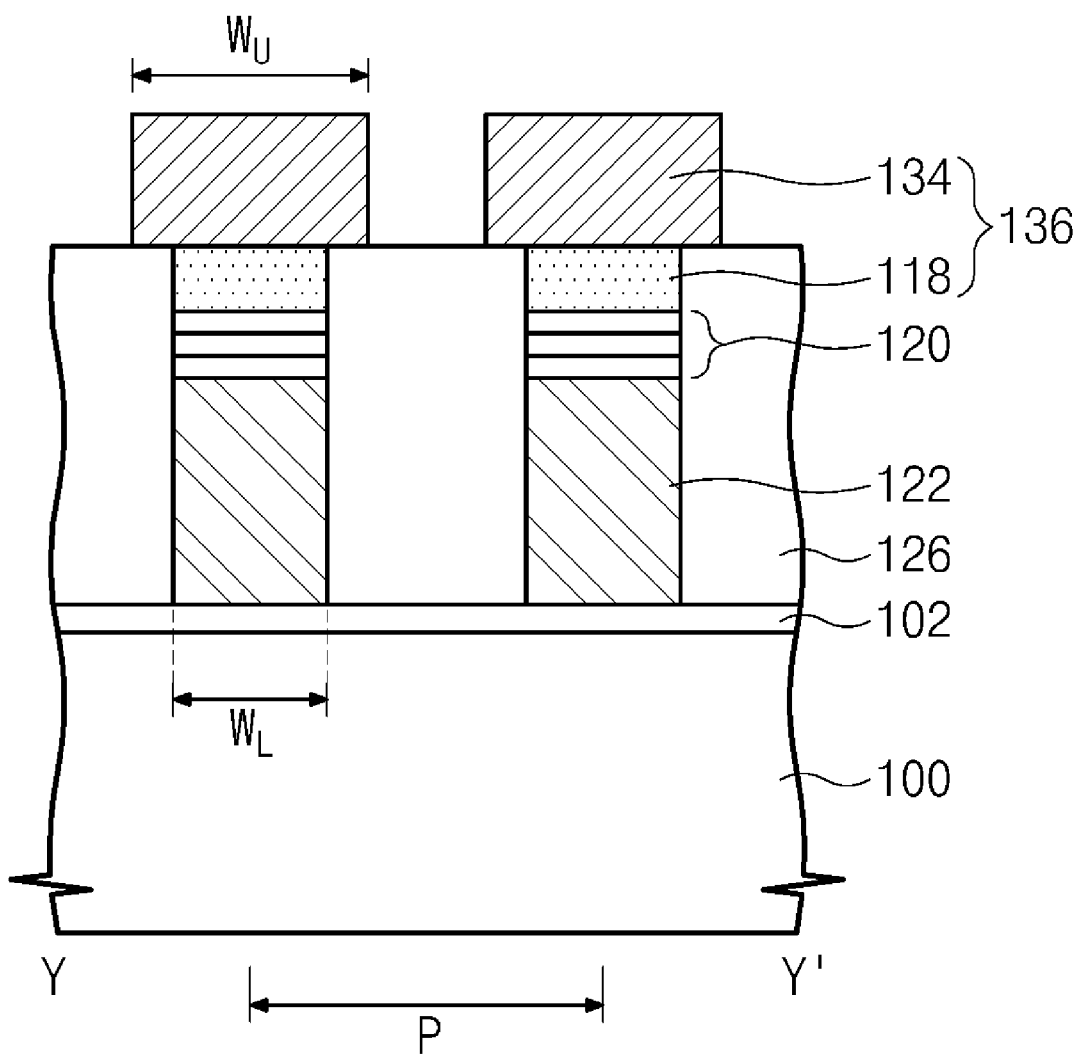
FIGS. 2P and 2Q show alternative cross sectional shapes taken along line y-y' of FIG. 2M.
Figure 2Q:
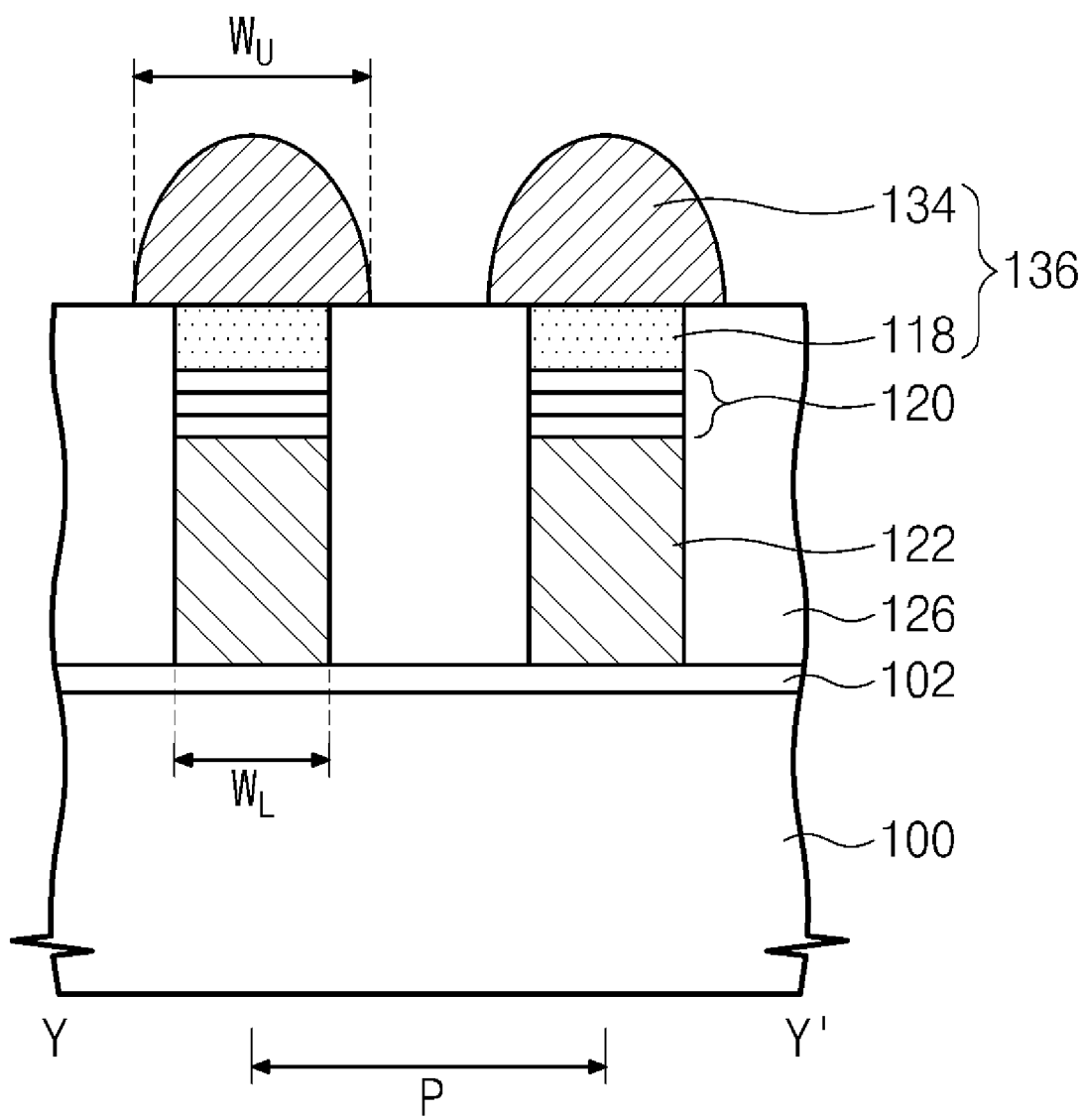

Referring to FIGS. 2M thorough 2O, a silicidation process may be performed on an upper portion of the second conductive pattern 118 and the third conductive pattern 132 to form a control gate 136. The upper portion 134 of the control gate 136 may be formed to have a trapezoidal shape. As will be recognized, the sidewalls of the trapezoidally shaped upper portion 134 may not be linear and may be rounded, such as shown in FIG. 2M. In addition, the cross sectional shape of the upper portion 134 need not be trapezoidal, but may instead be substantially rectangular, or rounded, such as exemplified by FIGS. 2P and 2Q, respectively, or have some other shape.

According to some embodiments, if a silicidation process is performed when the second conductive pattern 118 includes polysilicon doped with impurities, and the third conductive pattern 132 includes metal, the second and third conductive patterns 118 and 132 may be converted into an upper portion 134 of the control gate 136 including metal silicide. One of ordinary skill will recognize that design and process conditions may effect the level of silicidation. In some embodiments, silicide—polysilicon boundary may be substantially at the same level and/or co-planar with the upper surface of interlayer dielectric layer 126 (adjacent to the control gate 136), as disclosed in the figures. In other embodiments, the silicide—polysilicon boundary may extend above the upper surface of the dielectric layer 126 (e.g., into an internal portion of the upper portion 134), or may extend below the upper surface of the dielectric layer 126 (e.g., partly into conductive pattern 118).

To describe the silicidation process more specifically, a primary heat-treatment process may be performed on the second conductive pattern 118 and the third conductive pattern 132. Polysilicon and metal in the second and third conductive patterns 118 and 132 may be converted into metal silicide through the primary heat-treatment process. After the primary heat-treatment process, polysilicon or metal that is not reacted may be removed through a cleaning process. The portion 134 of the control gate 136 including metal silicide having a chemically stable structure may be formed by performing a secondary heat-treatment process.

The upper portion 134 of the control gate 136 may include metal silicide by the silicidation process, and the lower portion 118 of the control gate 136 may include polysilicon doped with impurities. Also, the upper portion 134 of the control gate 136 may have a width $W_U$ substantially greater than the width $W_L$ of the lower portion 118 of the control gate 136. For example, the upper portion 134 of the control gate 136 may have a width $W_U$ that is greater than the width of $W_L$ of the lower portion 118 of the control gate 136, or at least 20% greater than the width of $W_L$ of the lower portion 118 of the control gate 136. The width $W_L$ may be made small if desired, such as less than 40 nm. When considering a portion of the control gate with varying width, such as the trapezoidal shaped upper portion of the control gate, the width is considered to be the larger width, such as $W_{UB}$ (in view of the cross section taken perpendicular to the direction of the line length).

When the upper portion 134 of the control gate 136 has a trapezoidal shaped cross section, such as shown in FIG. 2O, the width of the bottom portion $W_{UB}$ of the trapezoidal cross section may be substantially greater than the width of the top $W_{UT}$ of the trapezoidal cross section. For example, the width of the bottom portion $W_{UB}$ of the trapezoidal cross section may be at least 20% greater than the width of the top $W_{UT}$ of the trapezoidal cross section.

Thus, since the upper portion 134 of the control gate 136 may include metal silicide, and may have a substantially greater width than that of the lower portion thereof, electrical resistance can be reduced. Since the control gate 136 may serve as a word line WL, a word line having a smaller electrical resistance can improve the operation speed of the memory device. For example, the silicided cross sectional area of the portion of the word line WL may be at least 20%, or at least 50% of the total cross sectional area of the word line WL.

Thus, a unit cell 138 including the floating gate 122, the dielectric pattern 120, and the control gate 136 may be formed on the tunnel dielectric layer 102. It should be noted that this invention has broad applicability outside of tightly spaced word line applications and is not limited to any particular pitch requirement. However, it may be beneficial to implement the invention when pitches (e.g., pitch P in FIGS. 2O-2Q) of lines are 45 nm or less. One example of use is in increasing memory cell density, such as NAND flash cell density, PRAM (phase-change RAM) cell density, RRAM (resistive RAM) cell density and MRAM (magnetoresistive) cell density, where word lines in these memory devices may be word line 136 described above. Modifications to other portions of the unit cell to that disclosed above particular to the memory device type will be apparent to one of ordinary skill and need not be set forth in detail here. The invention is also applicable to lines in memory devices other than word lines, for example bit lines or data lines. The invention is also applicable to other devices other than memory devices, such as LED (light emitting diode) arrays and CIS (CMOS image sensor) arrays, where the above described word line structure may be used as a row line to access a row of LEDs or light sensitive diodes, respectively, in these arrays. The row lines in the LED array and CIS array may have a pitch range as described herein with respect to memory devices.

(Memory Cell-Second Embodiment)

Figure 3A:
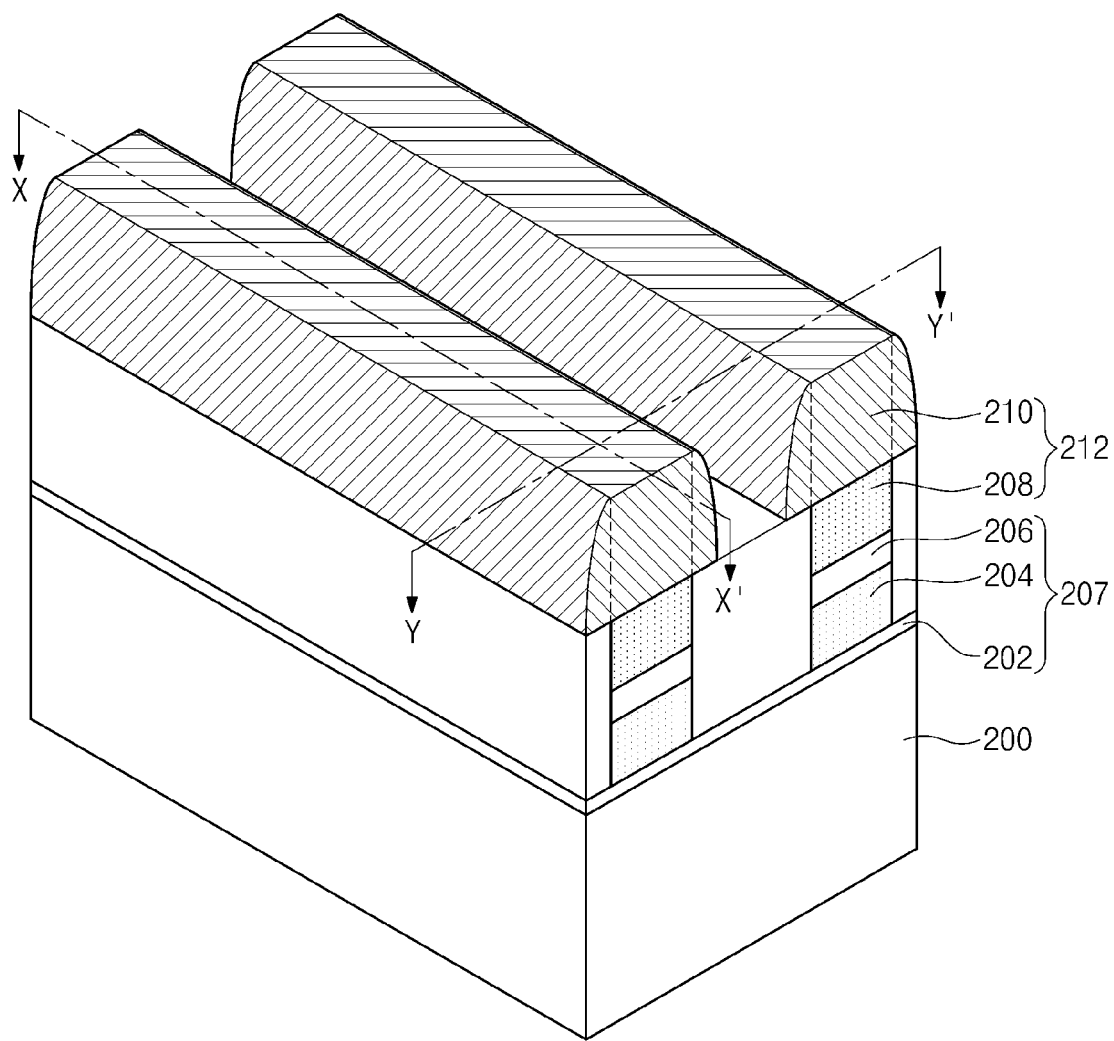
FIG. 3A is a perspective view illustrating a semiconductor device according to another exemplary embodiment.
Figure 3B:
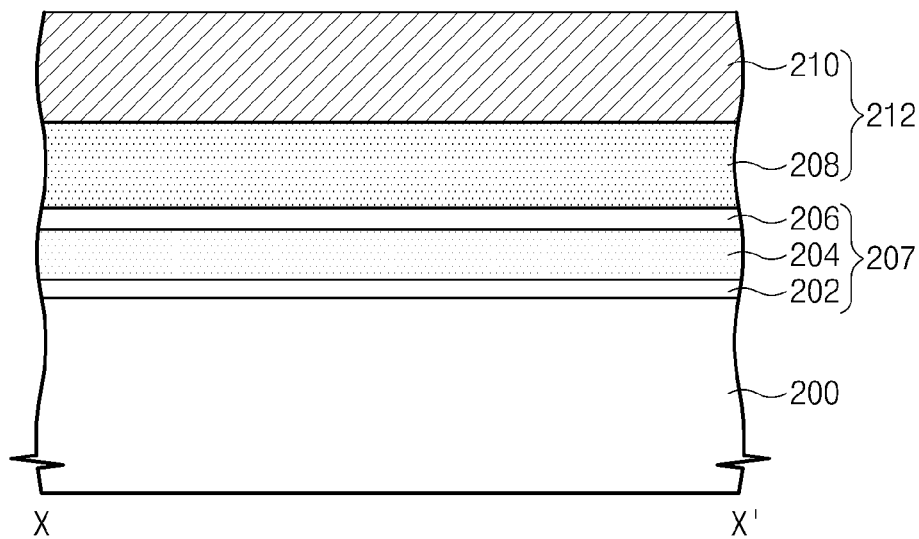
FIGS. 3B and 3C are cross-sectional views taken along lines x-x' and y-y' of FIG. 3A, respectively.
Figure 3C:
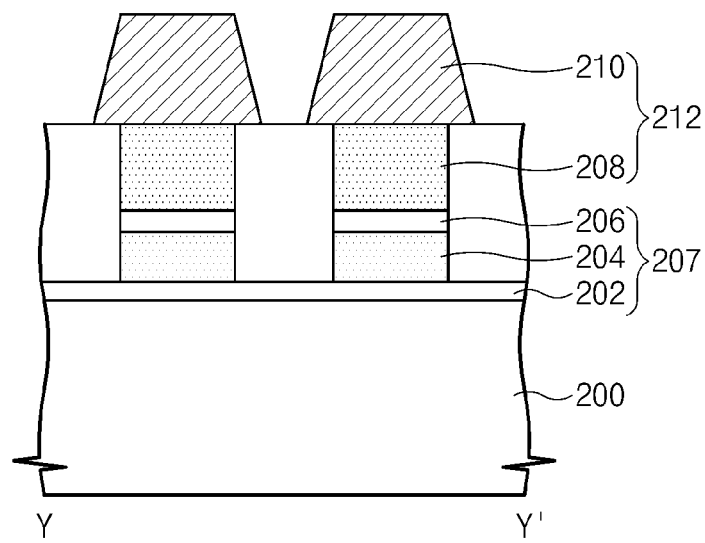

FIG. 3A is a perspective view illustrating a semiconductor device according to another exemplary embodiment. FIG. 3B is a cross-sectional view taken along line x-x' of FIG. 3A. FIG. 3C is a cross-sectional view taken along line y-y' of FIG. 3A

According to an exemplary embodiment, a semiconductor device may include a memory cell of a NAND flash memory. Also, in an embodiment, a memory cell may have a structure including a charge trap pattern and a gate.

Referring to FIGS. 3A through 3C, the semiconductor device may include a charge storage structure 207 and a gate 212 on a substrate 200.

The charge storage structure 207 may include a first insulation layer 202, a charge trap pattern 204, and a second insulation pattern 206.

The first insulation layer 202 may be disposed on the substrate 200. The first insulation layer 202 may include oxide. For example, the oxide may include silicon oxide or metal oxide. Examples of the metal oxide may include aluminum oxide, hafnium oxide, zirconium oxide, and lanthanum oxide.

The charge trap pattern 204 may be disposed on the first insulation layer 202. The charge trap pattern 204 may have a line structure extending in one direction. Also, the charge trap pattern 204 may include nitride, nanocrystal material, oxide, or a combination thereof. For example, the charge trap pattern 204 may include silicon nitride, aluminum oxide, hafnium oxide, or a combination thereof. Also, examples of nanocrystal material may include Si, SiGe, W, Co, Mo, CdSe, and WN.

The second insulation pattern 206 may have a line structure extending in the substantially same direction as the charge trap pattern 204. Also, the second insulation pattern 206 may include oxide, and may include silicon oxide or metal oxide. Examples of metal oxide may include aluminum oxide, hafnium oxide, zirconium oxide, and lanthanum oxide.

The gate 212 may have a line structure extending in the substantially same direction as the charge storage structure 207. The gate 212 may have an upper portion 210 and a lower portion 208. The upper portion 210 of the gate 212 may include metal silicide. Also, the upper portion 210 of the gate 212 may have a greater width downward, for example, may have a trapezoidal shape. However, other shapes may be implemented, such as those described above. The lower portion 208 of the gate 212 may include silicon. For example, the lower portion 208 of the gate 212 may include silicon doped with impurities. Also, the lower portion 208 of the gate 212 may have a certain width. The upper portion 210 of the gate 212 may have a thickness substantially equal to or greater than that of the lower portion 208 of the gate 212.

Thus, since the width of the upper portion 210 of the gate 212 becomes wider, the electrical resistance characteristics of the gate 212 can be improved. Since the gate 212 can serve as a word line WL, the word line WL having a smaller electrical resistance can improve the operating speed of the memory device. Details and modifications thereof described above with respect to the previous embodiments may be equally applicable to this embodiment, including without limitation details and alternative modifications to shape, size, relative sizes, materials, etc.

(NAND Flash Memory Device)

FIGS. 4A through 4K are cross-sectional views illustrating a method of fabricating a memory device according to another embodiment. FIGS. 4A through 4K are cross-sectional views taken by cutting a portion A of FIG. 1 in a bit line direction.

In an embodiment, the semiconductor device may be a NAND flash memory device.

Also, the NAND flash memory device may include a memory cell and a selection line. The memory cell may include a floating gate and control gate structure, which will be described in detail with reference to the first embodiment illustrated in FIGS. 2A through 2O.

Figure 4A:
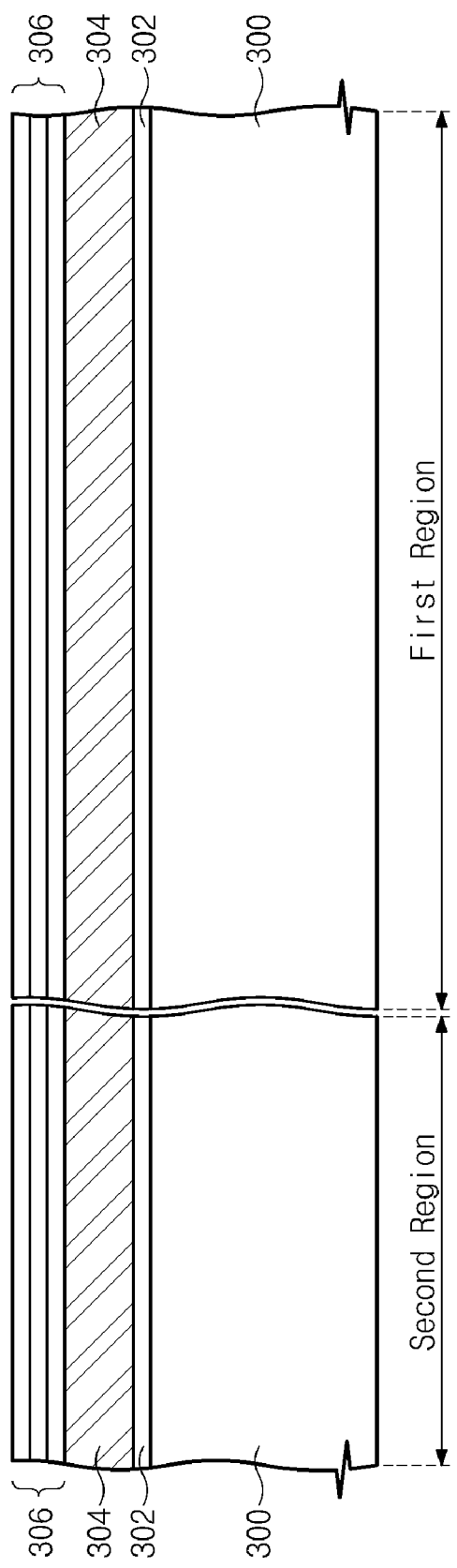

Referring to FIGS. 1 and 4A, an insulation layer 302 and a first conductive pattern 304 may be formed on a first region and a second region of a substrate 300. The first conductive pattern 304 may be extended in a first direction.

The substrate 300 may include the first region and the second region. The first region may be a region where a memory cell is formed, and the second region may be a region where a selection line is formed. The selection line may include a ground selection line GSL and a string selection line SSL.

Since a process for forming the insulation layer 302 and the first conductive pattern 304 may be substantially identical to the process for forming the tunnel dielectric layer 102 and the first conductive pattern 108, described with reference to FIGS. 2A through 2D, detailed description thereof will be omitted herein.

Referring to FIG. 4B, a dielectric layer 306 may be formed on the first conductive pattern 304. A portion of the dielectric layer 306 formed in the second region of the substrate 300 may be etched, which is called a butting process. The butting process may form a first opening 308 exposing an upper portion of the first conductive pattern 304.

Referring to FIG. 4C, a second conductive layer 310 and a mask 312 may be formed on the dielectric layer 306.

The second conductive layer 310 may be formed on the first and second regions of the substrate 300. According to an embodiment, the second conductive layer 310 may be formed to completely fill the first opening 308 of the second region. Accordingly, the first conductive pattern 304 and the second conductive layer 310 may be electrically connected.

Also, the mask 312 may have a line shape extending in a second direction different from the first direction.

Referring to FIG. 4D, the second conductive layer 310, the dielectric layer 306, and the first conductive pattern 304 may be etched by an etching process using the mask 312.

As a result of the etching process, a first preliminary unit cell 320 including a floating gate 314, a dielectric pattern 316, and a second conductive pattern 318 may be formed. In this case, the insulation layer 302 may serve as a tunnel dielectric layer. The floating gate 314 may have a hexahedral shape. When there are a plurality of first preliminary unit cells 320, a second opening 321 may be defined by the first preliminary unit cells 320.

Also, a second preliminary unit cell 326 including a first gate electrode 324, a dielectric pattern 316, and a second preliminary gate electrode 322 may be formed on the second region of the substrate 300. The first gate electrode 324 of the second region may correspond to the floating gate 314 of the first region, and the second preliminary gate electrode 322 may correspond to the second conductive pattern 318 of the second region. When there are a plurality of second preliminary unit cells 326, a third opening 327 may be defined by the second preliminary unit cells 326. The third opening 327 may have a width greater than that of the second opening 321.

Referring to FIG. 4E, a first interlayer dielectric 328 may be formed in the first and second regions of the substrate 300.

The first interlayer dielectric 328 may be formed on the substrate 300 to cover the first and second preliminary unit cells 320 and 326. Also, the first interlayer dielectric 328 may include oxide, for example, silicon oxide.

The first interlayer dielectric 328 may be formed on the mask 312 to completely fill the second and third openings 321 and 327 of the first and second regions. In this case, since the second opening 321 of the first region has a large aspect ratio, a void or seam 330 may be formed at an upper portion of the first interlayer dielectric 328 formed in the first region.

Referring to FIG. 4F, an etch stop layer 332 may be formed on the first interlayer dielectric 328.

The etch stop layer 332 may include material having an etch selectivity with respect to the first interlayer dielectric 328. Also, the etch stop layer 332 may include material having an etch selectivity with the second interlayer dielectric (334 of FIG. 4G) that is subsequently formed.

According to some embodiments, when the first interlayer dielectric 328 includes oxide, the etch stop layer 332 may include nitride. For example, the etch stop layer 332 may include silicon nitride.

Referring to FIG. 4G, a second interlayer dielectric 334 may be formed on the etch stop layer 332.

The second interlayer dielectric 334 may include oxide, for example, silicon oxide. Also, the second interlayer dielectric 334 may include the substantially same material as the first interlayer dielectric 328.

Referring to FIG. 4H, an upper portion of the second interlayer dielectric 334 may be etched.

According to some embodiments, the second interlayer dielectric 334 may be etched to expose the upper surface of the etch stop layer 332. The etching process may include an etch back process.

Figure 4I:
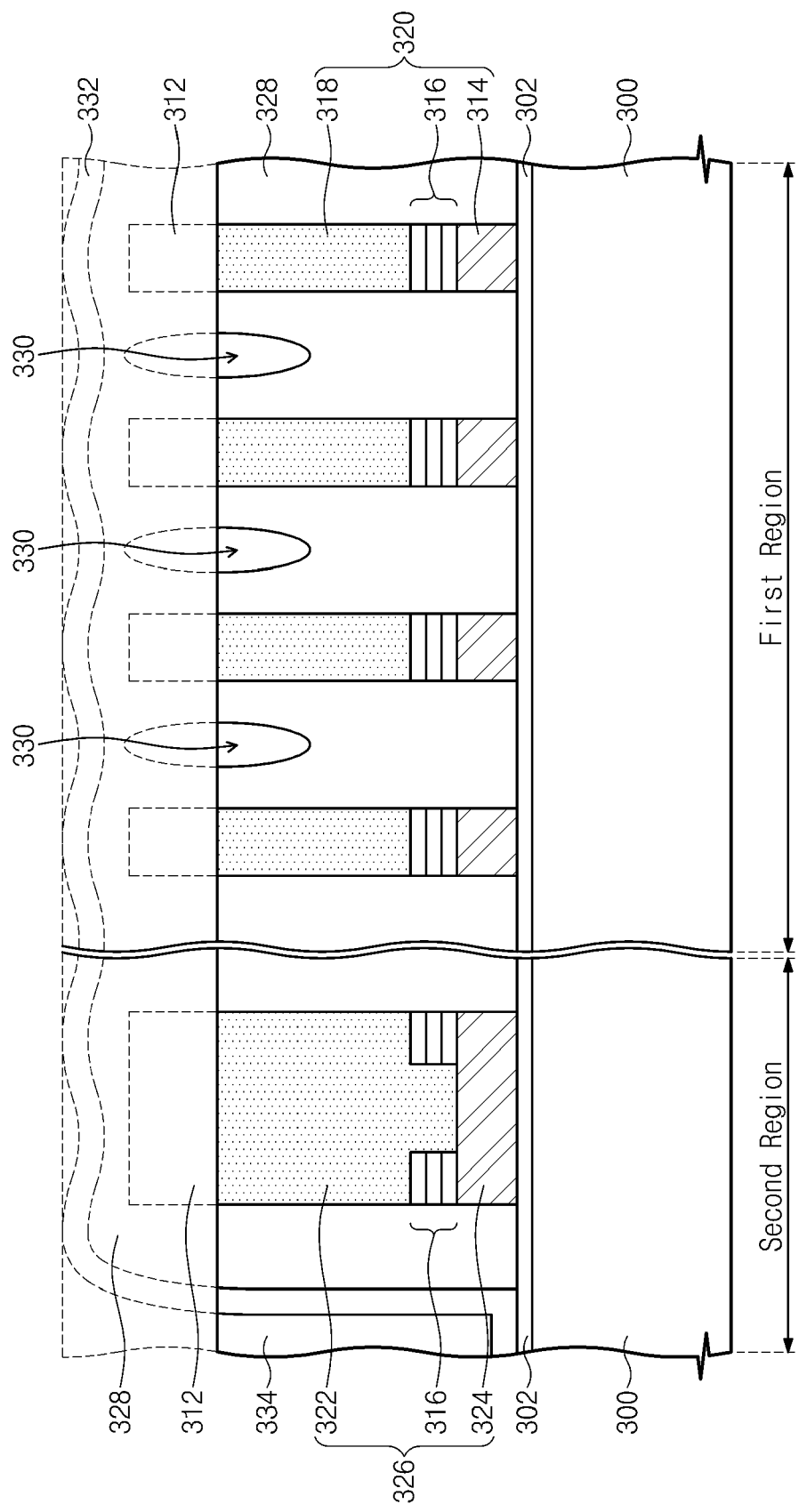

Referring to FIG. 4I, the etch stop layer 332 and the first interlayer dielectric 328 may be partially etched, and the mask 312 may be removed.

According to some embodiments, the etch stop layer 332 may be etched to expose the upper surface of the mask 312. While the etch stop layer 332 is being etched, the second interlayer dielectric 334 remaining on the etch stop layer 332 may be etched. Next, the mask 312 may be removed to expose the upper surface of the second conductive pattern 318 of the first region and the upper surface of a preliminary gate electrode of the second region. While the mask 312 is being removed, an upper portion of the first interlayer dielectric 328 may be partially etched. The etching process may be an etch back process.

As a result of the etching process, the upper surface of the first interlayer dielectric 328 may have the substantially same level as the upper surface of the second conductive pattern 318 and the second preliminary gate electrode 322.

Also, while the etching process is being performed, the void or seam 330 in the first interlayer dielectric 328 may be exposed to the outside. The size of the exposed void or seam 330 may be extended by the etching process.

Figure 4J:
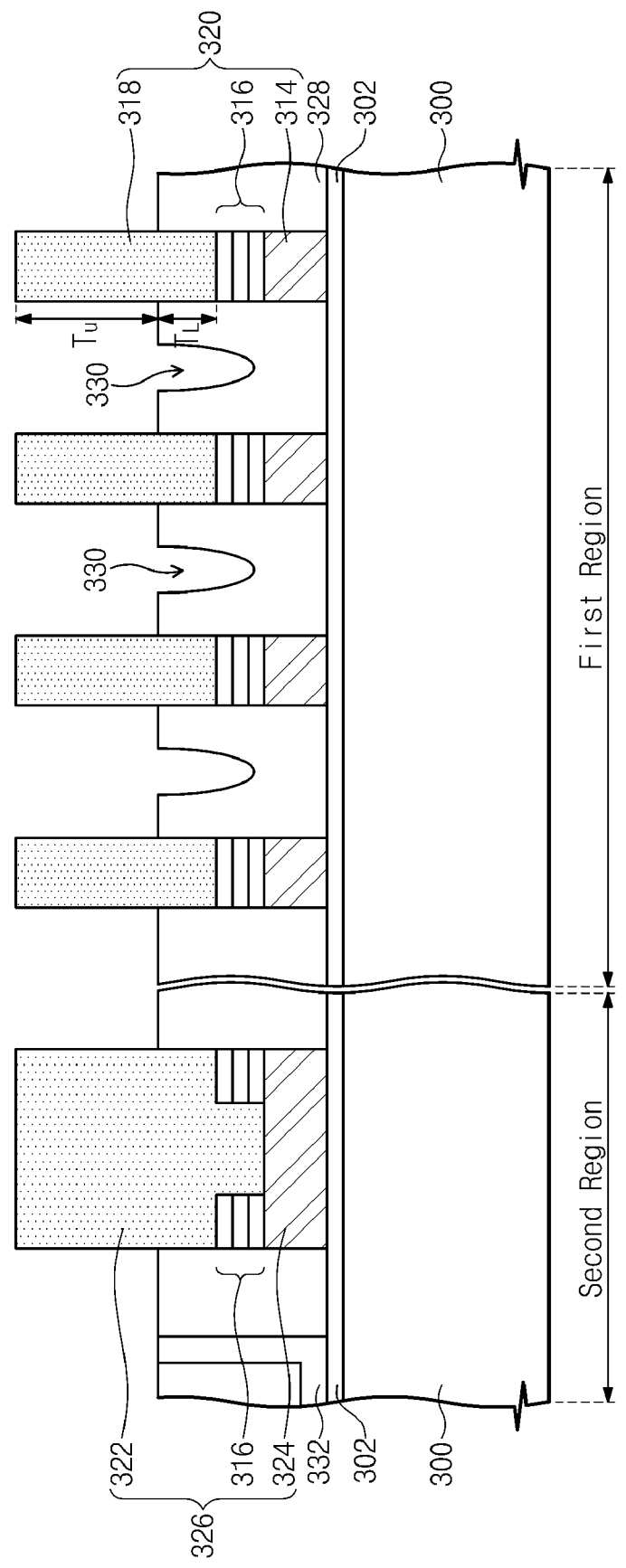

Referring to FIG. 4J, the first interlayer dielectric 328 may be etched to expose the upper portion of the second preliminary gate electrode 322 and the upper portion of the second conductive pattern 318.

The thickness $T_U$ of the upper portion of the second conductive pattern 318 may be substantially equal to or greater than the thickness $T_L$ of the lower portion of the second conductive pattern 318. In this case, the lower portion of the second conductive pattern 318 may be the portion below the surface of the first interlayer dielectric 328 adjacent the second conductive pattern 318, and the upper portion of the second conductive pattern 318 may be the portion protruding above the first interlayer dielectric 328. The alternative thickness relationships of the portions of the word line described above with respect to other embodiments may also be implemented.

Also, the thickness of the upper portion of the second preliminary gate electrode 322 may be substantially equal to or greater than the thickness of the lower portion of the second preliminary gate electrode 322. In this case, the lower portion of the second preliminary gate electrode 322 may be the portion below the surface of the first interlayer dielectric 328 adjacent the second preliminary gate electrode 322, and the upper portion of the second preliminary gate electrode 322 may be the portion protruding above the first interlayer dielectric 328. The alternative thickness relationships of the portions of the word line described above with respect to other embodiments may also be implemented.

Figure 4K:
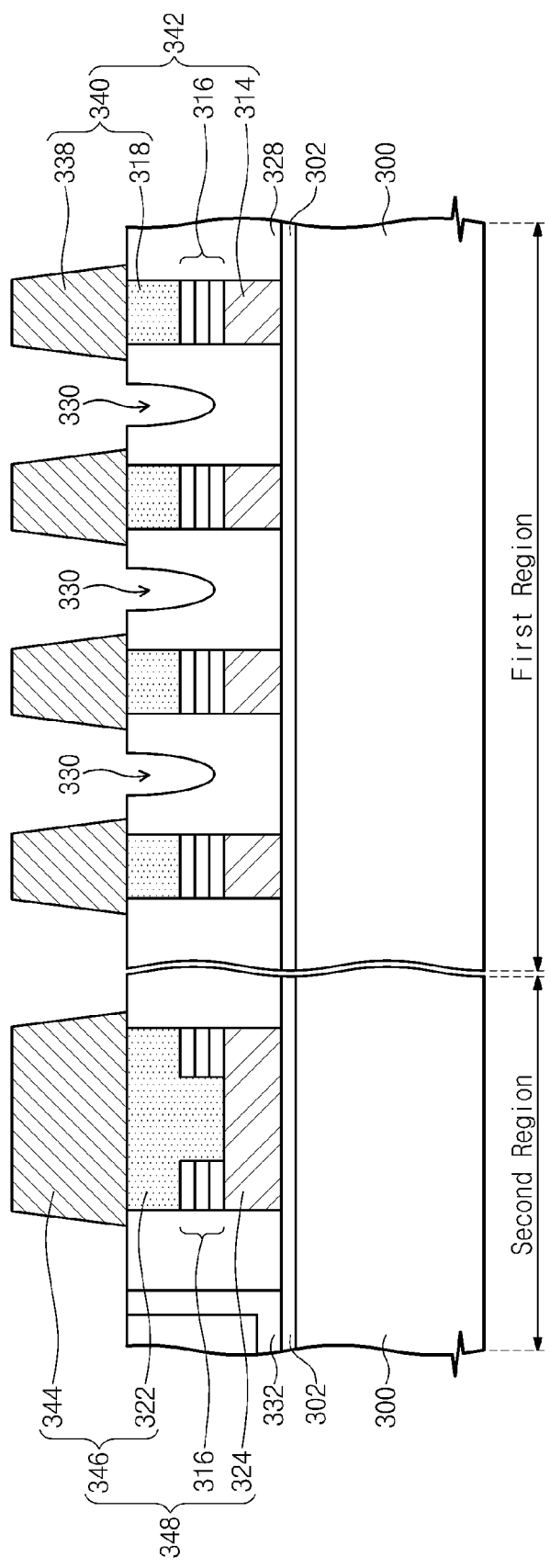

Referring to FIG. 4K, a second gate electrode 346 and a control gate 340 may be formed through a silicidation process.

The control gate 340 may have a lower portion 316 including silicon, and an upper portion 338 including metal silicide. The upper portion 338 of the control gate 340 may have a width substantially greater than that of the lower portion 316, and may have a trapezoidal shape. Thus, a first unit cell 342 including the control gate 340, the dielectric pattern 316, and the floating gate 314 may be formed in the first region of the substrate 300.

The second gate electrode 346 may have a lower portion 322 including silicon, and an upper portion 344 including metal silicide. The upper portion 344 of the second gate electrode 346 may have a width substantially greater than that of the lower portion 322 of the second gate electrode 346, and may have a trapezoidal shape. Thus, a second unit cell 348 including the second gate electrode 346, the dielectric pattern 316, and the first gate electrode 324 may be formed in the second region of the substrate 300.

Since the process for forming the upper portion 344 of the second gate electrode 346 and the upper portion 338 of the control gate 340 is substantially identical to the process for forming the upper portion of the control gate 136 including metal silicide and the upper portion 134, detailed description thereof will be omitted herein. Details and modifications thereof described above with respect to the previous embodiments may be equally applicable to this embodiment, including without limitation details and alternative modifications to shape, size, relative sizes, materials, etc.

The first unit cell 342 formed in the first region of the substrate 300 may serve as a memory cell. Also, the second unit cell 348 formed in the second region of the substrate 300 may serve as a selection line.

(Application)

Figure 5A:
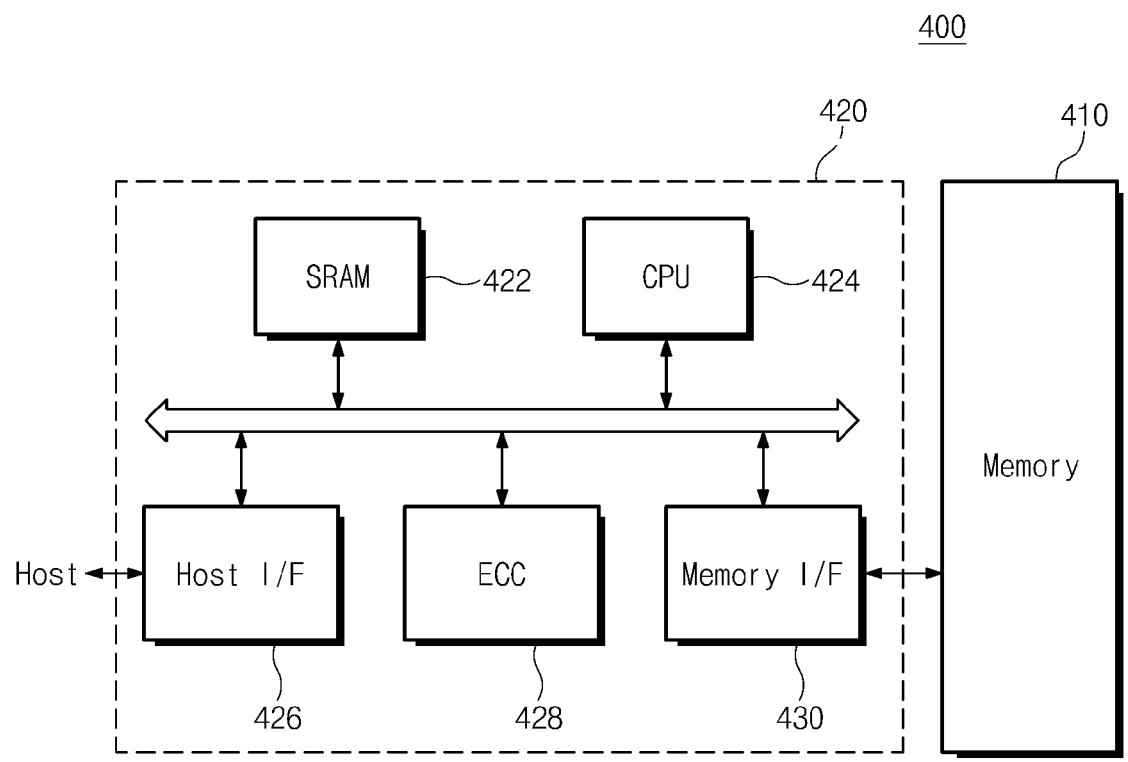
FIG. 5A is a block diagram illustrating a memory card including semiconductor devices according to another exemplary embodiment.

FIG. 5A is a block diagram illustrating a memory card including a semiconductor device according to an exemplary embodiment.

Referring to FIG. 5A, a memory including a semiconductor device manufactured according to an embodiment may be applied to a memory card 400.

As an example, the memory card 400 may include a memory controller 420 removing overall data exchanges between a host and a memory 410. An SRAM 422 may be used as an operating memory of a CPU 424. A host interface 426 may include a data exchange protocol of the host connected to the memory card. An Error Correction Code (ECC) 428 may detect and correct an error included in data read from the memory 410. A memory interface 430 may interface with the memory 410. The CPU 424 may perform overall control operations for the data exchange of the memory controller 420.

The memory 410 applied in the memory card 400 may include a semiconductor device manufactured according to an embodiment. In this case, the width of an upper portion of a gate may increase to improve the operating speed of the semiconductor device.

Figure 5B:
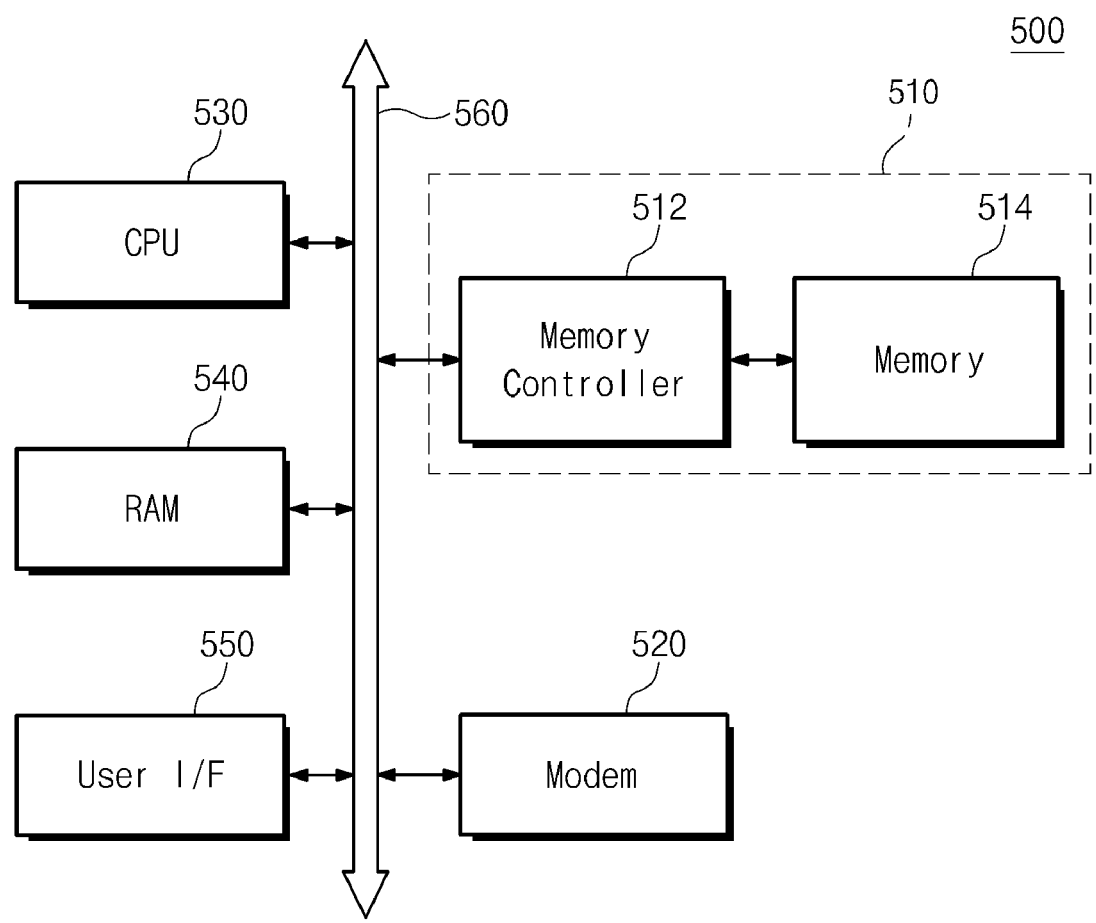
FIG. 5B is a block diagram illustrating an information processing system to which semiconductor devices are applied.

FIG. 5B is a block diagram illustrating an information processing system to which a semiconductor device according to an exemplary embodiment is applied.

Referring to FIG. 5B, an information processing system 500 may include a memory system 510 including a semiconductor device according to an embodiment. The information processing system 500 may include a mobile device or a computer. As an example, the information processing system 500 may include a memory system 510, a modem 520, a CPU 530, a RAM 540, a user interface 550 that are electrically connected to a system bus 560, respectively. The memory system 510 may store data processed by the CPU 530 or data inputted from the outside. The memory system 510 may include a memory 512 and a memory controller 514, and may be configured substantially similarly to the memory card 500 described with reference to FIG. 5A. The information processing system 500 may be provided to memory cards, Solid State Disks (SSDs), Camera Image Sensors (CISs), and other application chipsets. As an example, the memory system 510 may be configured with an SSD. In this case, the information processing system 500 may store large-capacity data in the memory system 510 stably and reliably.

According to some embodiments, since a gate including an upper portion having a width greater than that of a lower portion is formed, electrical resistance of the gate can be reduce. Accordingly, electrical characteristics of a semiconductor device including the gate can be improved.

The above-disclosed subject matter is to be considered illustrative and not restrictive, and the appended claims are intended to cover all such modifications, enhancements, and other embodiments, which fall within the true spirit and scope of the claimed invention. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
  a plurality of memory cells aligned in a first direction including a first memory cell having a charge storage structure on a substrate, the charge storage structure including a charge trap pattern; and
  a conductive line extending in the first direction, the conductive line including a gate on the charge storage structure, the gate including a lower portion formed of silicon and an upper portion formed of metal silicide, the conductive line being connected to the plurality of memory cells,
  wherein, with respect to a cross section of the gate taken in a direction perpendicular to the first direction, the upper portion of the gate formed of metal silicide has a width greater than that of the lower portion of the gate formed of silicon, wherein, with respect to the cross section of the gate taken in the direction perpendicular to the first direction, the upper portion of the gate formed of metal silicide has a first thickness in a vertical direction with respect to the substrate, and the lower portion of the gate formed of silicon has a second thickness in the vertical direction, wherein the first thickness is substantially equal to or greater than the second thickness, and wherein, with respect to the cross section of the gate taken in a direction perpendicular to the first direction, the width of the lower portion of the gate is equal to a width of an insulator pattern on the charge trap pattern and below the lower portion of the gate.

2. The semiconductor device of claim 1, wherein, with respect to the cross section of the gate taken in the direction perpendicular to the first direction, the lower portion of the gate has a uniform width.

3. The semiconductor device of claim 2, wherein, with respect to the cross section taken of the gate in the direction perpendicular to the first direction, the upper portion of the gate has a minimum width equal to or greater than the uniform width of the lower portion of the gate.

4. The semiconductor device of claim 1, wherein the upper portion of the gate includes cobalt silicide (CoSix), nickel silicide (NiSix), molybdenum silicide (MoSix), titanium silicide (TiSix), tantalum silicide (TaSix), or a combination thereof.

5. The semiconductor device of claim 1, further comprising an interlayer dielectric filling a gap of a structure in which the charge storage structure and the gate are stacked.

6. The semiconductor device of claim 5, wherein the interlayer dielectric covers the lower portion of the gate and exposes the upper portion of the gate.

7. The semiconductor device of claim 1, wherein the charge storage structure includes a tunnel dielectric layer, a floating gate, and a dielectric pattern.

8. The semiconductor device of claim 1, wherein the charge storage structure includes a first insulation layer, a charge trap pattern, and a second insulation pattern.

9. A semiconductor device comprising:
a substrate comprising a first region and a second region;
a memory device in the first region of the substrate, the memory device comprising a plurality of memory cells aligned in a first direction including a first memory cell having a charge storage structure and a conductive line extending in the first direction including a first gate, the conductive line being connected to the plurality of memory cells; and
a selection device in the second region of the substrate, the selection device comprising an insulation layer, a second gate and a source/drain region,
wherein the first gate includes a lower portion formed of silicon and an upper portion formed of metal silicide, and
wherein, with respect to a cross section of the first gate taken in a direction perpendicular to the first direction, the upper portion of the first gate formed of metal silicide has a width greater than that of the lower portion of the first gate formed of metal silicide,
wherein, with respect to the cross section of the first gate taken in the direction perpendicular to the first direction, the upper portion of the gate formed of metal silicide has a first thickness in a vertical direction with respect to the substrate, and the lower portion of the gate formed of silicon has a second thickness in the vertical direction, and wherein the first thickness is substantially equal to or greater than the second thickness.

10. The semiconductor device of claim 9, wherein the second gate includes a lower portion formed of silicon and an upper portion formed of metal silicide, and, with respect to a cross section of the second gate taken in the direction perpendicular to the first direction, the upper portion of the second gate formed of metal silicide has a width greater than that of the lower portion of the second gate formed of silicon.

11. The semiconductor device of claim 9, further comprising an interlayer dielectric disposed about the memory device and the selection device, wherein the lower portions of the first and second gates do not extend above a top layer of the interlayer dielectric, and the upper portions of the first and second gates are formed above the top layer of the interlayer dielectric.

12. The semiconductor device of claim 9, wherein the upper portions of the first and second gates have thicknesses equal to or greater than those of the lower portions of the first and second gates, respectively.

13. A semiconductor device comprising:
a plurality of memory cells aligned in a first direction including a first memory cell having a charge storage structure on a substrate, the charge storage structure including a charge trap pattern; and
a conductive line extending in the first direction including a gate on the charge storage structure, the gate including a lower portion formed of silicon and an upper portion formed of a metal silicide, the conductive line being connected to the plurality of memory cells,
wherein the upper portion of the gate formed of the metal silicide has a height substantially equal to or greater than a height of the lower portion formed of silicon;
wherein, with respect to a cross section of the gate taken in a direction perpendicular to the first direction, the upper portion of the gate formed of the metal silicide has a width greater than that of the lower portion of the gate formed of silicon, and
wherein, with respect to the cross section of the gate taken in a direction perpendicular to the first direction, the width of the lower portion of the gate is equal to a width of the insulator pattern on the charge trap pattern and below the lower portion of the gate.

14. A semiconductor device comprising:
a plurality of memory cells aligned in a first direction including a first memory cell having a charge storage structure on a substrate; and
a conductive line extending in the first direction including a gate on the charge storage structure, the gate including a lower portion formed of silicon and an upper portion formed of metal silicide, the conductive line being connected to the plurality of memory cells,
wherein, with respect to a cross section of the gate taken in a direction perpendicular to the first direction, the upper portion of the gate formed of metal silicide has a width greater than that of the lower portion of the gate formed of silicon,
wherein, with respect to the cross section of the gate taken in the direction perpendicular to the first direction, the upper portion of the gate formed of metal silicide has a first thickness in a vertical direction with respect to the substrate, and the lower portion of the gate formed of silicon has a second thickness in the vertical direction, and
wherein the first thickness is substantially equal to or greater than the second thickness, and wherein the upper portion of the gate has a narrower upper portion and a wider upper portion, and wherein the wider upper portion is disposed a distance closer to the lower portion of the gate than a distance that the narrower upper portion is disposed from the lower portion of the gate.

15. The semiconductor device of claim 1,
wherein the conductive line is one of a plurality of conductive lines extending in the first direction, and
wherein a pitch between the plurality of conductive lines is 45 nm or less.

16. The semiconductor device of claim 15, wherein the plurality of conductive lines are a plurality of word lines.

17. The semiconductor device of claim 1, wherein the width of the lower portion of the gate formed of silicon is less than 40 nm.

18. A semiconductor device comprising:
a plurality of memory cells aligned in a first direction including a first memory cell having a charge storage structure on a substrate; and
a conductive line extending in the first direction including a gate on the charge storage structure, the gate including a lower portion formed of silicon and an upper portion formed of metal silicide, the conductive line being connected to the plurality of memory cells,
wherein, with respect to a cross section of the gate taken in a direction perpendicular to the first direction, the upper portion of the gate formed of metal silicide has a width greater than that of the lower portion of the gate formed of silicon,
wherein, with respect to the cross section of the gate taken in the direction perpendicular to the first direction, the upper portion of the gate formed of metal silicide has a first thickness in a vertical direction with respect to the substrate, and the lower portion of the gate formed of silicon has a second thickness in the vertical direction,
wherein the first thickness is substantially equal to or greater than the second thickness, and
wherein, with respect to the cross section of the gate taken in the direction perpendicular to the first direction, the upper portion of the gate formed of metal silicide has a cross sectional area of at least 20% of the total cross sectional area of the conductive line.

19. The semiconductor device of claim 18, wherein, with respect to the cross section of the gate taken in the direction perpendicular to the first direction, the upper portion of the gate formed of metal silicide has a cross sectional area of at least 50% of the total cross sectional area of the conductive line.

20. The semiconductor device of claim 18, wherein the conductive line is a word line.

21. The semiconductor device of claim 9,
wherein the conductive line is one of a plurality of conductive lines extending in the first direction, and
wherein a pitch between the plurality of conductive lines is 45 nm or less.

22. The semiconductor device of claim 21, wherein the plurality of conductive lines are a plurality of word lines.

23. The semiconductor device of claim 9, wherein the width of the lower portion of the gate formed of silicon is less than 40 nm.

24. The semiconductor device of claim 9, wherein, with respect to the cross section of the first gate taken in the direction perpendicular to the first direction, the upper portion of the gate formed of metal silicide has a cross sectional area of at least 20% of the total cross sectional area of the conductive line.

25. The semiconductor device of claim 24, wherein, with respect to the cross section of the first gate taken in the direction perpendicular to the first direction, the upper portion of the gate formed of metal silicide has a cross sectional area of at least 50% of the total cross sectional area of the conductive line.

26. The semiconductor device of claim 24, wherein the conductive line is a word line.

27. The semiconductor device of claim 11, wherein the upper portions of the first and second gates contact the top layer of the interlayer dielectric.

28. The semiconductor device of claim 14, further comprising an interlayer dielectric disposed about the plurality of memory cells, wherein the lower portion of the first gate does not extend above a top layer of the interlayer dielectric, and the upper portion of the first gate is formed above the top layer of the interlayer dielectric.

29. The semiconductor device of claim 28, wherein the upper portion of the first gate contacts the top layer of the interlayer dielectric.

30. The semiconductor device of claim 18, further comprising an interlayer dielectric disposed about the plurality of memory cells, wherein the lower portion of the first gate does not extend above a top layer of the interlayer dielectric, and the upper portion of the first gate is formed above the top layer of the interlayer dielectric.

31. The semiconductor device of claim 30, wherein the upper portion of the first gate contacts the top layer of the interlayer dielectric.

32. A method of fabricating a semiconductor device, comprising:
forming a preliminary charge storage structure and a first conductive layer comprising a semiconductor material on a substrate;
forming a charge storage structure and a first conductive semiconductor pattern by etching the preliminary charge storage structure and the first conductive layer, wherein the first conductive pattern has a lower portion and an upper portion;
forming a second conductive pattern including metal on the upper portion of the first conductive semiconductor pattern, wherein the second conductive pattern is disposed on sidewalls of the upper portion of the first conductive semiconductor pattern and none of the second conductive pattern is disposed on a top surface of the upper portion of the first conductive semiconductor pattern; and
forming a gate from the upper portion of the first conductive semiconductor pattern, the second conductive pattern, and the lower portion of the first conductive pattern,
wherein the forming of the gate is performed by heating so as to cause a chemical reaction between the first conductive semiconductor pattern and the second conductive pattern.

33. The method of claim 32, wherein the first conductive pattern comprises a silicon material, and the second conductive pattern comprises a metal.

* * * * *